United States Patent
Chiang et al.

(10) Patent No.: US 10,756,089 B2
(45) Date of Patent: Aug. 25, 2020

(54) HYBRID SEMICONDUCTOR TRANSISTOR STRUCTURE AND MANUFACTURING METHOD FOR THE SAME

(71) Applicant: TAIWAN SEMICONDUCTOR MANUFACTURING COMPANY LTD., Hsinchu (TW)

(72) Inventors: Hung-Li Chiang, Taipei (TW); I-Sheng Chen, Taipei (TW); Tzu-Chiang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/981,167

(22) Filed: May 16, 2018

(65) Prior Publication Data

US 2019/0355724 A1 Nov. 21, 2019

(51) Int. Cl.
| | |
|---|---|
| *H01L 29/06* | (2006.01) |
| *H01L 27/092* | (2006.01) |
| *H01L 29/78* | (2006.01) |
| *H01L 29/786* | (2006.01) |
| *H01L 21/02* | (2006.01) |
| *H01L 21/8238* | (2006.01) |
| *H01L 29/66* | (2006.01) |
| *H01L 21/324* | (2006.01) |
| *H01L 29/161* | (2006.01) |

(52) U.S. Cl.
CPC .... *H01L 27/0922* (2013.01); *H01L 21/02356* (2013.01); *H01L 21/324* (2013.01); *H01L 21/823807* (2013.01); *H01L 21/823821* (2013.01); *H01L 29/0673* (2013.01); *H01L 29/0684* (2013.01); *H01L 29/161* (2013.01); *H01L 29/66545* (2013.01); *H01L 29/7851* (2013.01); *H01L 29/78696* (2013.01)

(58) Field of Classification Search
CPC .......... H01L 27/0922; H01L 21/02356; H01L 21/324; H01L 21/823807; H01L 21/823821; H01L 29/0673; H01L 29/0684; H01L 29/161; H01L 29/66545; H01L 29/7851; H01L 29/78696
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Matthew C Landau
*Assistant Examiner* — Dmitriy Yemelyanov
(74) *Attorney, Agent, or Firm* — Birch, Stewart, Kolasch & Birch, LLP

(57) ABSTRACT

Present disclosure provides a hybrid semiconductor transistor structure, including a substrate, a first transistor on the substrate, a channel of the first transistor including a fin and having a first channel height, a second transistor adjacent to the first transistor, a channel of the second transistor including a nanowire, and a separation laterally spacing the fin from the nanowire. The first channel height is greater than the separation. Present disclosure also provides a method for manufacturing the hybrid semiconductor transistor structure.

20 Claims, 26 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2013/0043512 A1* | 2/2013 | Huang .............. H01L 21/02164 257/288 |
| 2015/0340438 A1* | 11/2015 | Zhu .................. H01L 29/78648 257/77 |
| 2016/0204131 A1* | 7/2016 | Cheng ................ H01L 27/1211 257/351 |
| 2017/0011969 A1* | 1/2017 | Leobandung ......... H01L 21/845 |
| 2017/0104061 A1* | 4/2017 | Peng .................. H01L 21/3081 |

* cited by examiner

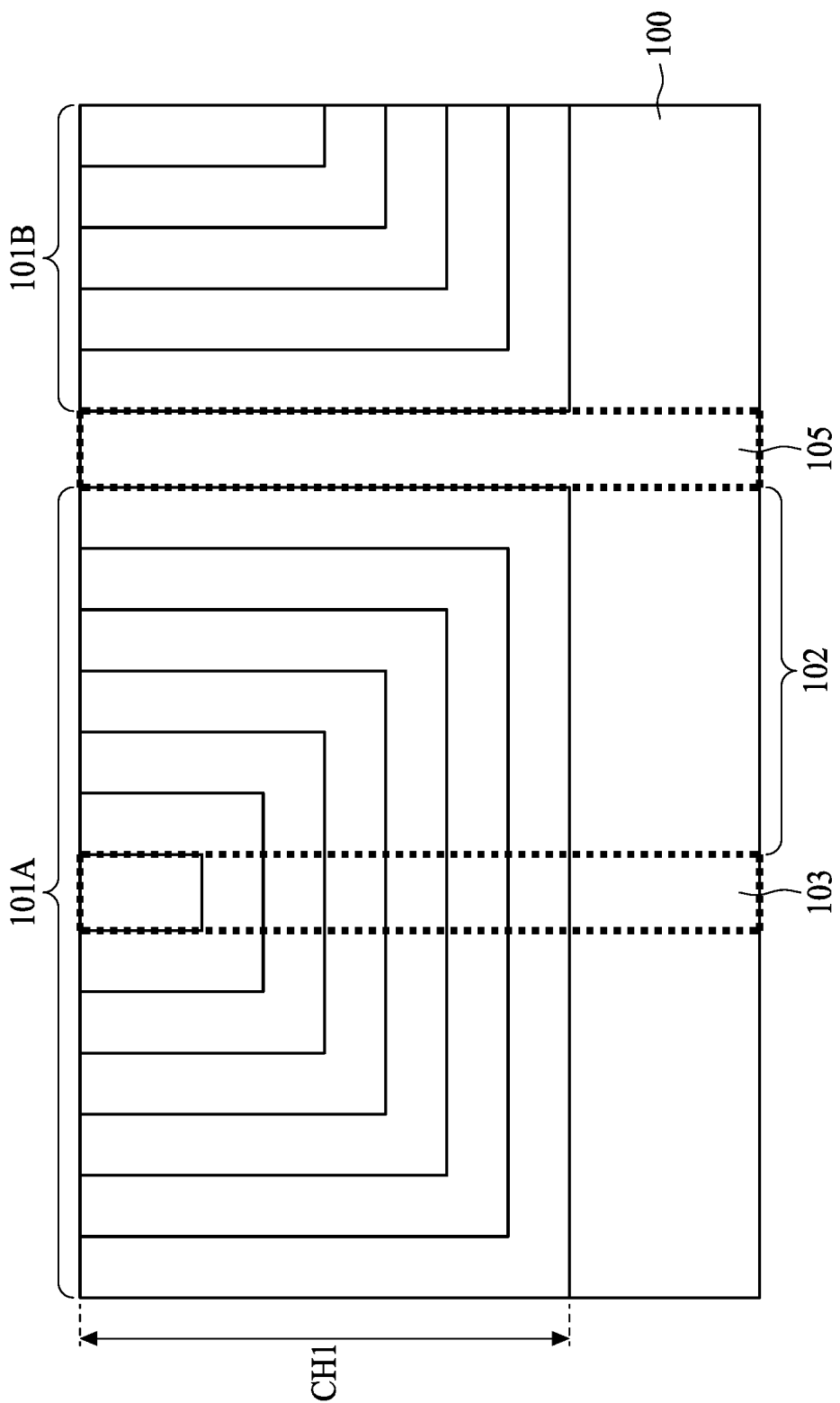

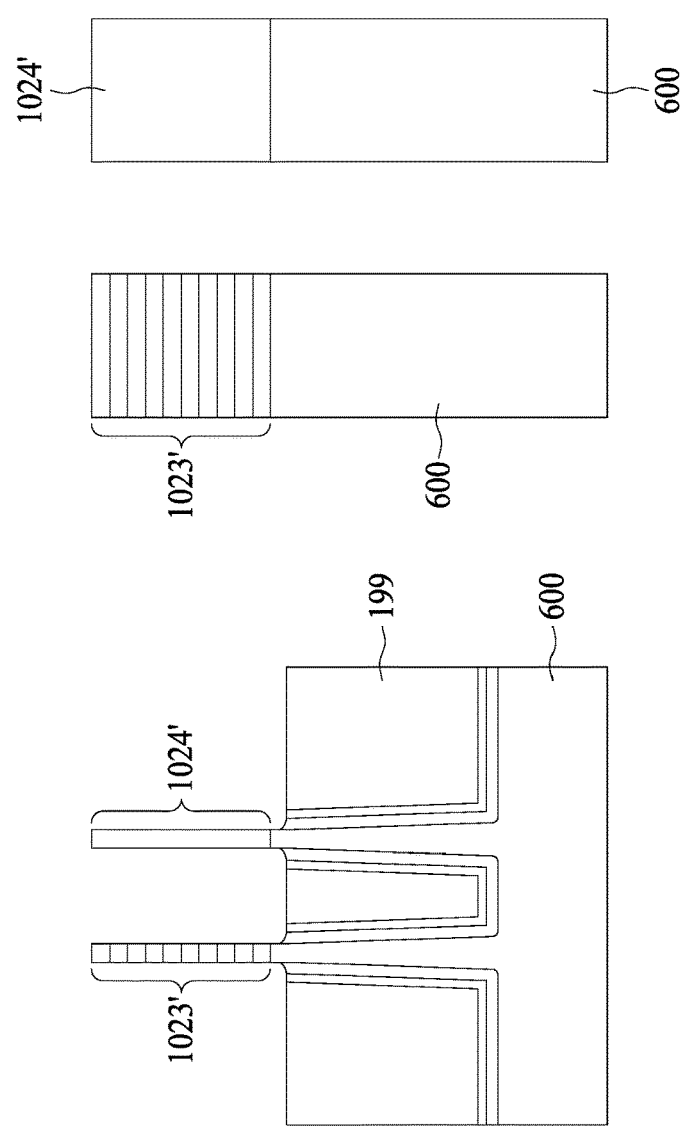
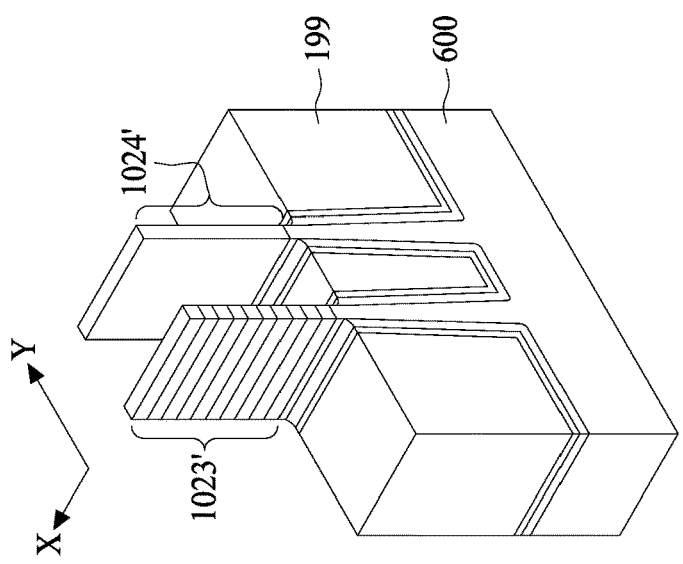
FIG. 9A   FIG. 9B   FIG. 9C   FIG. 9D

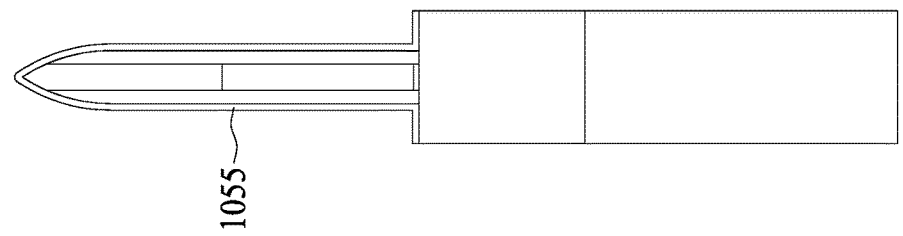
FIG. 13D
FIG. 13C
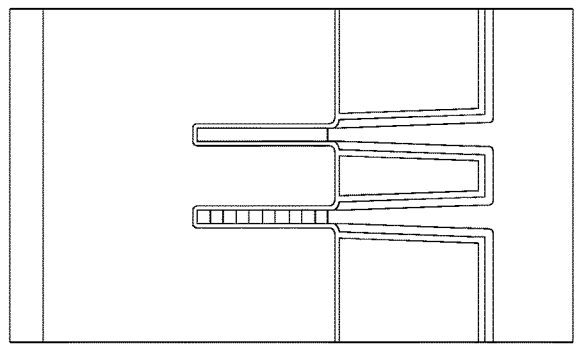
FIG. 13B
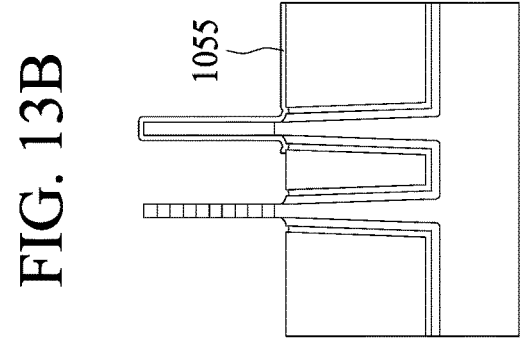
FIG. 13B'
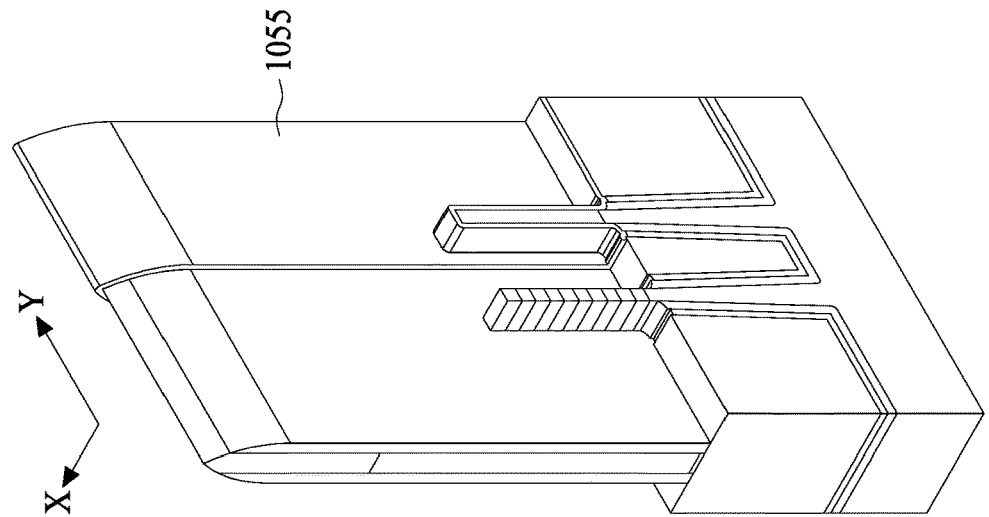
FIG. 13A

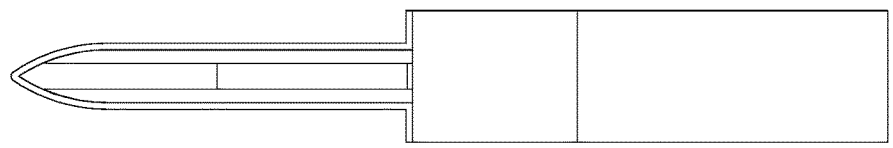
FIG. 14D
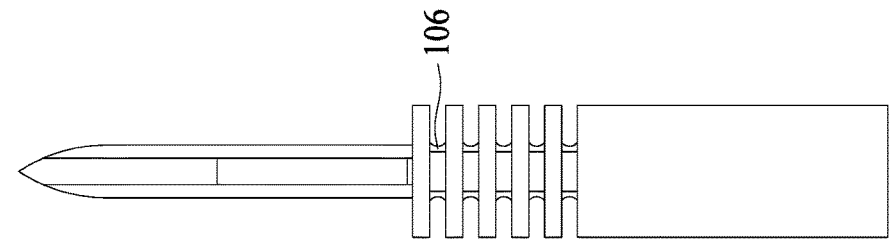
FIG. 14C
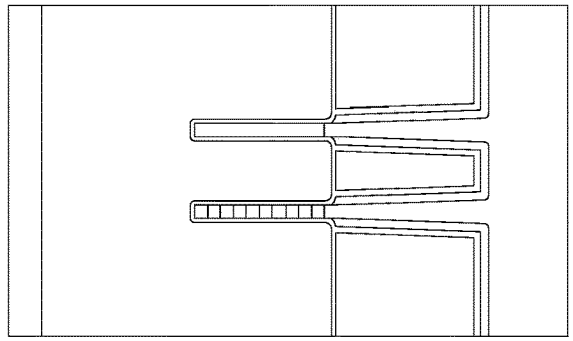
FIG. 14B
FIG. 14B'
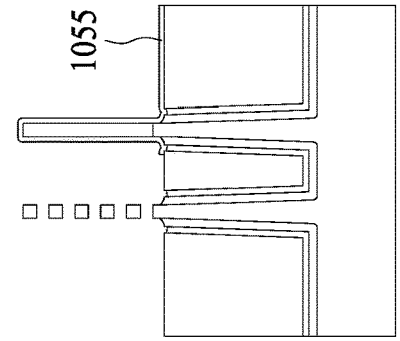
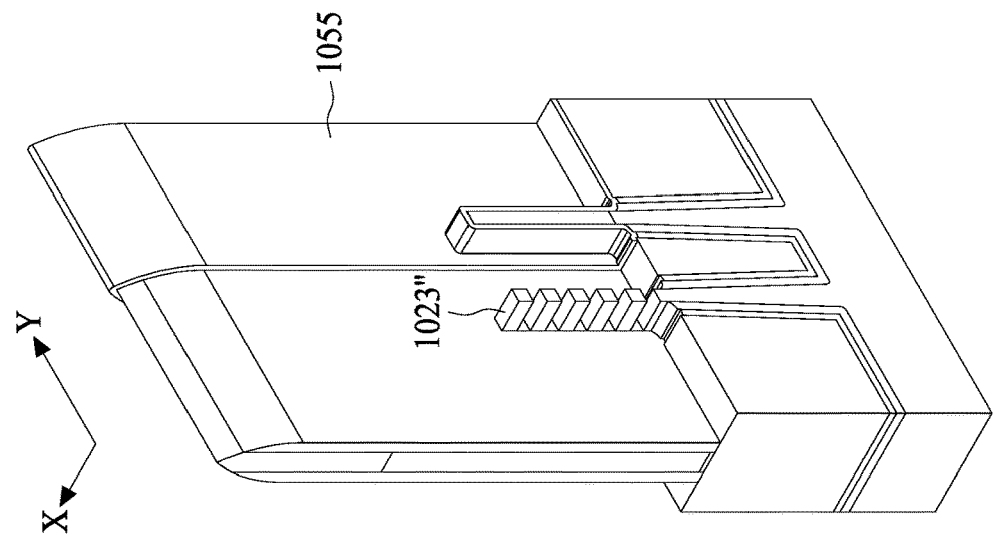
FIG. 14A

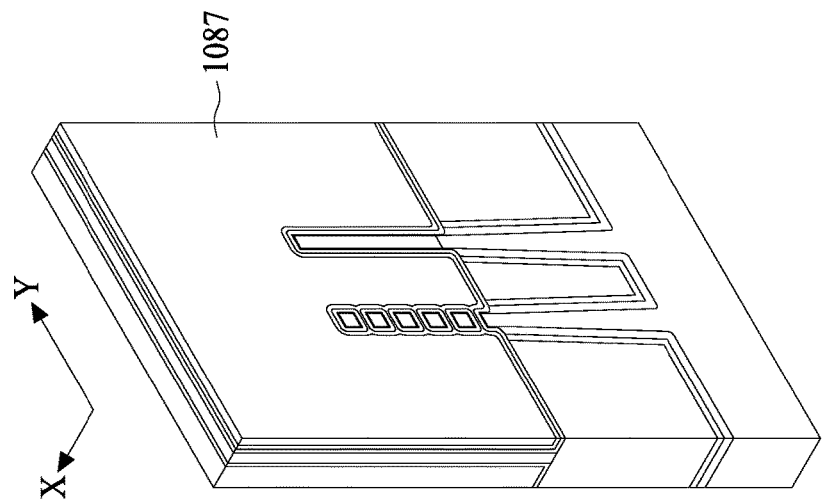
FIG. 25A
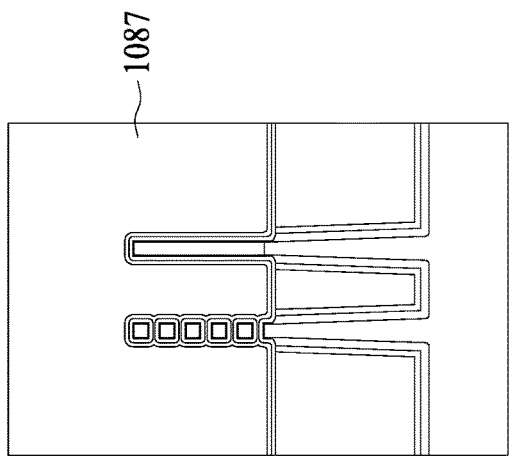
FIG. 25B
FIG. 25B'
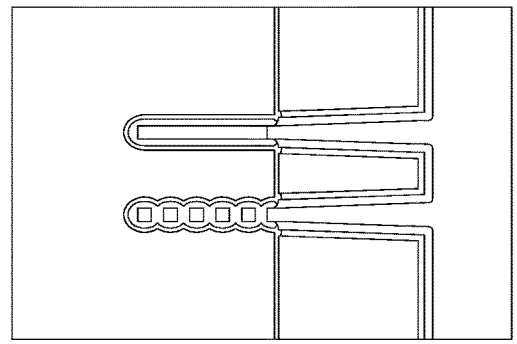
FIG. 25C
FIG. 25D

US 10,756,089 B2

HYBRID SEMICONDUCTOR TRANSISTOR STRUCTURE AND MANUFACTURING METHOD FOR THE SAME

BACKGROUND

To achieve an increase in circuit density of integrated circuits, the size of semiconductor devices, such as field-effect transistors, within such integrated circuits has decreased. Decreasing the size of a semiconductor device can, however, result in a reduction in the length of a channel of the semiconductor device. Reducing the channel length can result in a source region and a drain region of the semiconductor device being closer to one another, which can allow the source and drain region to exert undue influence over the channel, or rather over carriers within the channel, commonly referred to as short-channel effects. Consequently, a gate of a semiconductor device that suffers from short-channel effects has reduced control over the channel, which, among other things, inhibits the ability of the gate to control on and/or off states of the semiconductor device.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 1 is a cross section view showing a type of the hybrid design at an intermediate manufacturing stage.

FIG. 9A to FIG. 9D are a 3D perspective view, a cross sectional view dissecting along an Y direction, a cross sectional view dissecting along an X direction at N-region, and a cross sectional view dissecting along an X direction at P-region, respectively, of a type of hybrid semiconductor structure during an intermediate stage of manufacturing operations, in accordance with some embodiments of the present disclosure.

FIG. 13A, FIG. 13B, FIG. 13B', FIG. 13C, FIG. 13D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.

FIG. 14A, FIG. 14B, FIG. 14B', FIG. 14C, FIG. 14D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.

FIG. 25A, FIG. 25B, FIG. 25B', FIG. 25C, FIG. 25D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.

DETAILED DESCRIPTION OF THE DISCLOSURE

Figure 2A:
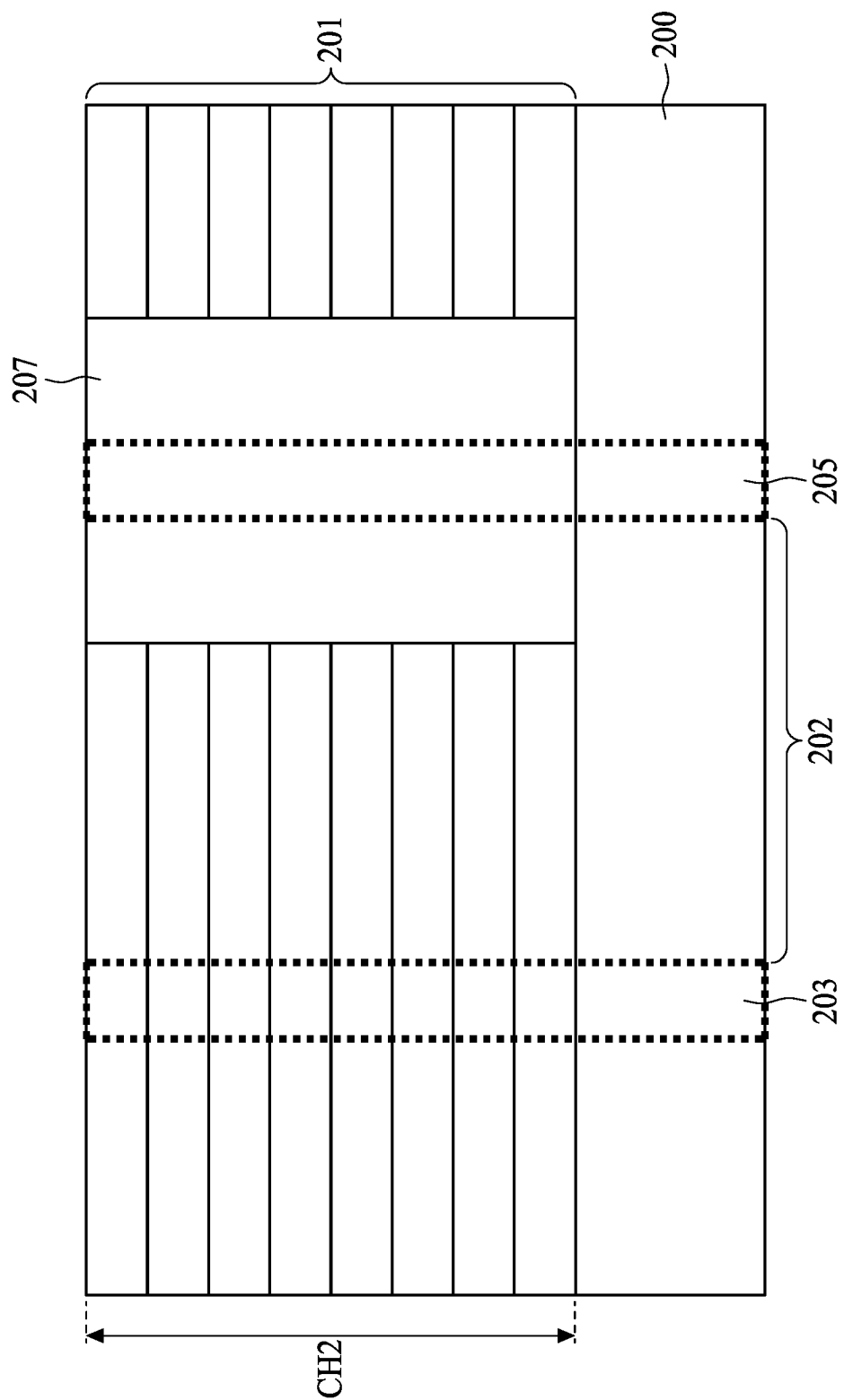
FIG. 2A is a cross sectional view showing a type of hybrid design semiconductor structure during an intermediate stage of manufacturing operations, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line.

Multiple gate field-effect transistors (MuGFETs) are a recent development in semiconductor technology which typically is metal oxide semiconductor FETs (MOSFETs) that incorporate more than one gate into a single device. One type of MuGFET is referred to as a FinFET, which is a transistor structure with a fin-like semiconductor channel that is raised vertically away from a substrate of an integrated circuit. A recent design for FinFETs is a gate all around (GAA) FinFET, which has a gate material that surrounds a channel region on all sides.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

A hybrid design of the MuGFETs includes a FET of a first conductive type being a FinFET, and at least another FET of a second conductive type being a GATE-ALL-AROUND structure. Referring to FIG. 1, FIG. 1 shows a type of the hybrid design at an intermediate manufacturing stage. A stacked epitaxy region 101A is spaced from an adjacent stacked epitaxy region 101B. Due to the fact that any of the stacked epitaxy region 101A and 101B is formed in a trench recessed from a substrate 100, the deposited epitaxy films would take on the contour of the trench and appear to be a U-shaped stack. For example, the region 103 surrounded by the dotted line turns out to be an n-FET and the region 105 surrounded by the dotted line turns out to be a p-FET in subsequent operations. It is observed that the spacing between the n-FET and the p-FET, which is called an n/p boundary 102, is occupied by the vertical stacks of the epitaxy films or the epitaxy films grown on the sidewall of the trench. The hybrid structure illustrated in FIG. 1 faces a problem of area penalty caused by the existence of n/p boundary 102, For example, the n/p boundary 102 of FIG. 1 can be about the same magnitude as the channel height CH1, such as from about 50 nm to about 80 nm. The n/p boundary 102 reduction cannot be alleviated by advanced alignment or lithography techniques because it is limited by the geometry of the trench.

Present disclosure provides a new hybrid design of the MuGFET which solves the area penalty caused by the n/p boundary. Referring to FIG. 2A, FIG. 2A shows a type of the hybrid design at an intermediate manufacturing stage, according to some embodiments of present disclosure. In FIG. 2A, no recess is framed in the substrate 200 prior to the formation of the stacked epitaxy 201, hence a horizontal profile of the stacked epitaxy 201 can be obtained. A FinFET well 207 having substantial equal width from top to bottom is regrown in the stacked epitaxy 201. For example, region 203 surrounded by the dotted line turns out to be an n-FET and the region 205 surrounded by the dotted line turns out to be a p-FET in subsequent operations. The spacing between the n-FET and the p-FET, or the n/p boundary 202, can be reduced to an extent dictated by photolithography limit. For example, in the present embodiment, the n/p boundary 202 can be about one-fourth to one-fifth of the channel height CH2, such as from about 10 nm to about 20 nm. In some embodiments, the regrown FinFET well can be disposed in an n-FET of a hybrid design.

Figure 3:
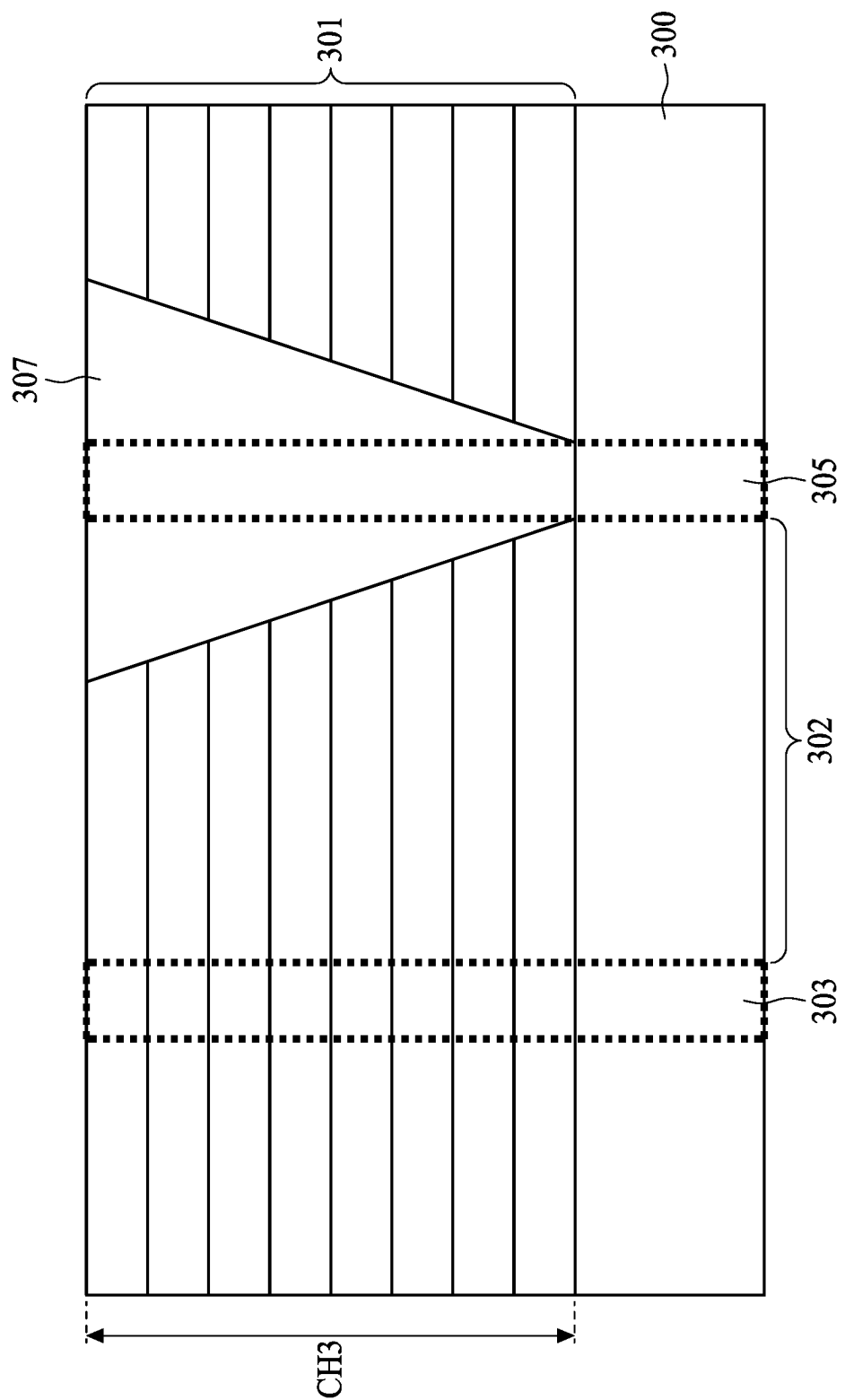
FIG. 3 is a cross sectional view showing a type of hybrid design semiconductor structure during an intermediate stage of manufacturing operations, in accordance with some embodiments of the present disclosure.

Referring to FIG. 3, FIG. 3 shows a type of the hybrid design at an intermediate manufacturing stage, according to some embodiments of present disclosure. In FIG. 3, no recess is framed in the substrate 300 prior to the formation of the stacked epitaxy 301, hence a horizontal profile of the stacked epitaxy 301 can be obtained. A FinFET well 307 having a shape tapering toward the substrate 300, that is, having a wider top and a narrower bottom, is regrown in the stacked epitaxy 301. The tapering shape of the FinFET well 307 can be adopted when the material of the FinFET well 307 and the underlying substrate 300 having different lattice constants and thus inducing mismatch stress. The tapering shape of the FinFET well 307 can foster the relaxation at the lattice mismatch interface and thus obtaining a strain free FinFET well 307. Region 303 surrounded by the dotted line turns out to be an n-FET and the region 305 surrounded by the dotted line turns out to be a p-FET in subsequent operations. The spacing between the n-FET and the p-FET, or the nip boundary 302, can be reduced to an extent dictated by photolithography limit. For example, in the present embodiment, the n/p boundary 302 can be about one-fourth to one-fifth of the channel height CH3, such as from about 10 nm to about 20 nm. In some embodiments, the regrown FinFET well can be disposed in an n-FET of a hybrid design.

Figure 2B:
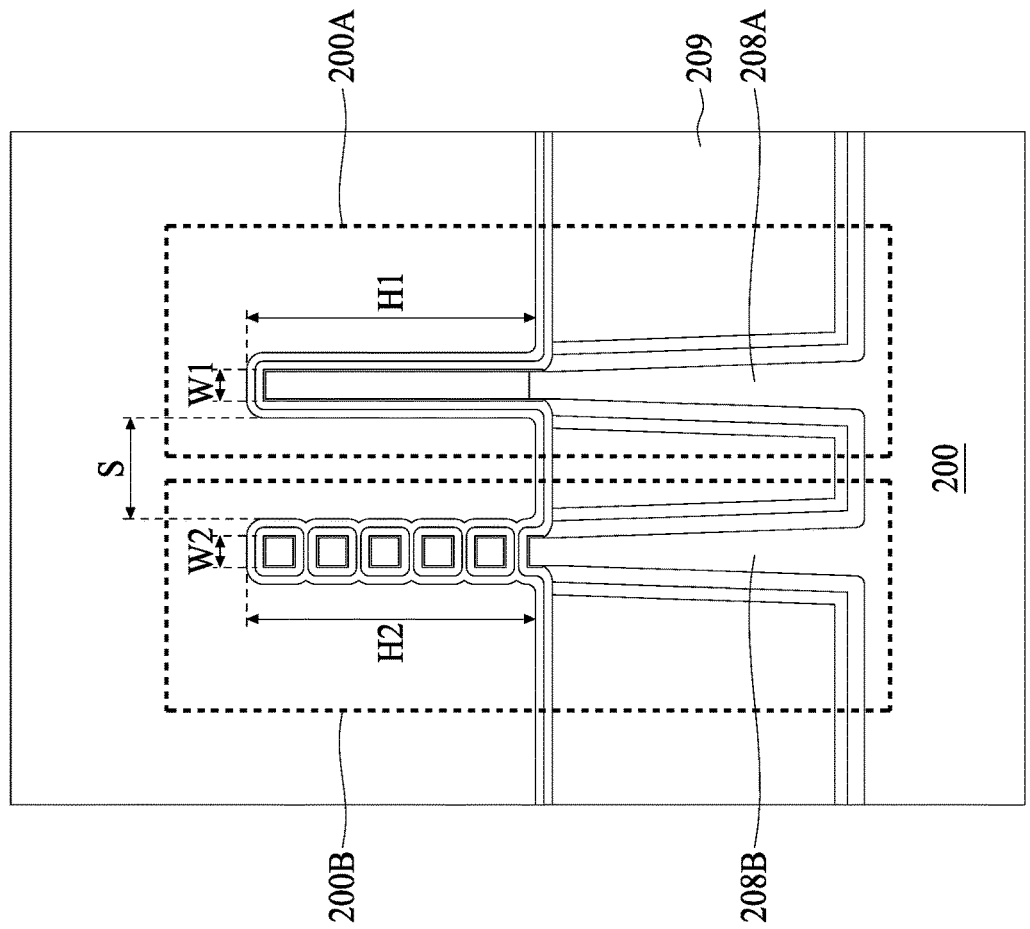
FIG. 2B is a cross sectional view of a gate region of a hybrid semiconductor transistor region, in accordance with some embodiments of the present disclosure.

Referring to FIG. 2B, FIG. 2B is a cross section dissecting at a gate region of a hybrid semiconductor transistor structure 20, according to some embodiments of the present disclosure. As shown in FIG. 2B, the structure 20 includes a substrate 200, and at least a first transistor 200A and a second transistor 200B. The first transistor 200A has a first channel height H1 measured at a portion of a first fin 208A protruding from an isolation 209. The second transistor 200B has a second channel height H2 measured at a nanowire portion of a second fin 208B. A separation S laterally spacing the portion of a first fin 208A protruding from an isolation 209 from the nanowire portion of a second fin 208B can be observed in the cross section illustrated in FIG. 2B. In some embodiments, the first channel height H1 is greater than 2 times, 3 times, or 4 times of the separation S. In some embodiments, the second channel height H2 is substantially identical to the first channel height and being greater than the separation S. In some embodiments, for example, under 5 nm technology node and beyond, the first channel height H1 is at least about 50 nm to about 80 nm, and the separation S is less than about 10 to 20 nm.

As shown in FIG. 2B, the portion of the first fin 208A protruding from the isolation 209 can be composed of material different from that of the portion of the first fin 208A surrounded by the isolation 209. Similarly, the portion of the first fin 208A protruding from the isolation 209 can be composed of material different from that of the substrate 200. In some embodiments, the substrate 200 and the first fin 208A surrounded by the isolation 209 are composed of silicon, whereas the portion of the first fin 208A protruding from the isolation 209 can be composed of silicon germanium or other III-V compounds, depending on the performance requirement of the device. In some embodiments, the portion of the first fin 208A protruding from the isolation 209 is composed of $Si_xGe_{1-x}$, where the X being less than 0.6. Such high germanium content can be obtained by a germanium condensation operation subsequently depicted in FIG. 10A to FIG. 10D or FIG. 20A to FIG. 20D of present disclosure.

In FIG. 2B, the nanowire portion of the second fin 208B can be composed of material identical to the portion of the second fin 208B surrounded by the isolation 209 or material identical to the substrate 200.

In some embodiments, first transistor 200A is a p-FET since hole mobility does not degrade with the reduction of lateral dimension, and the channel region of the p-FET can remain a fin shape with reduced fin width W1. In contrast, the second transistor 200B is an n-FET with gate-all-around channel because the electron mobility being more sensitive to the reduction of lateral dimension, and the channel region of the n-FET is replaced by nanowires having a diameter W2 greater than the fin width W1. Possessing a nanowire channel having a diameter of W2 greatly reduces the leakage current and alleviates short channel effect compared to possessing a fin channel having a fin width of W2. In some embodiments, the fin width W1 can be less than 6 nm and the diameter W2 can be greater than or equal to 6 nm. In some embodiments, the fin width W1 is about 4 nm and the diameter W2 is about 6 nm.

Figure 4:
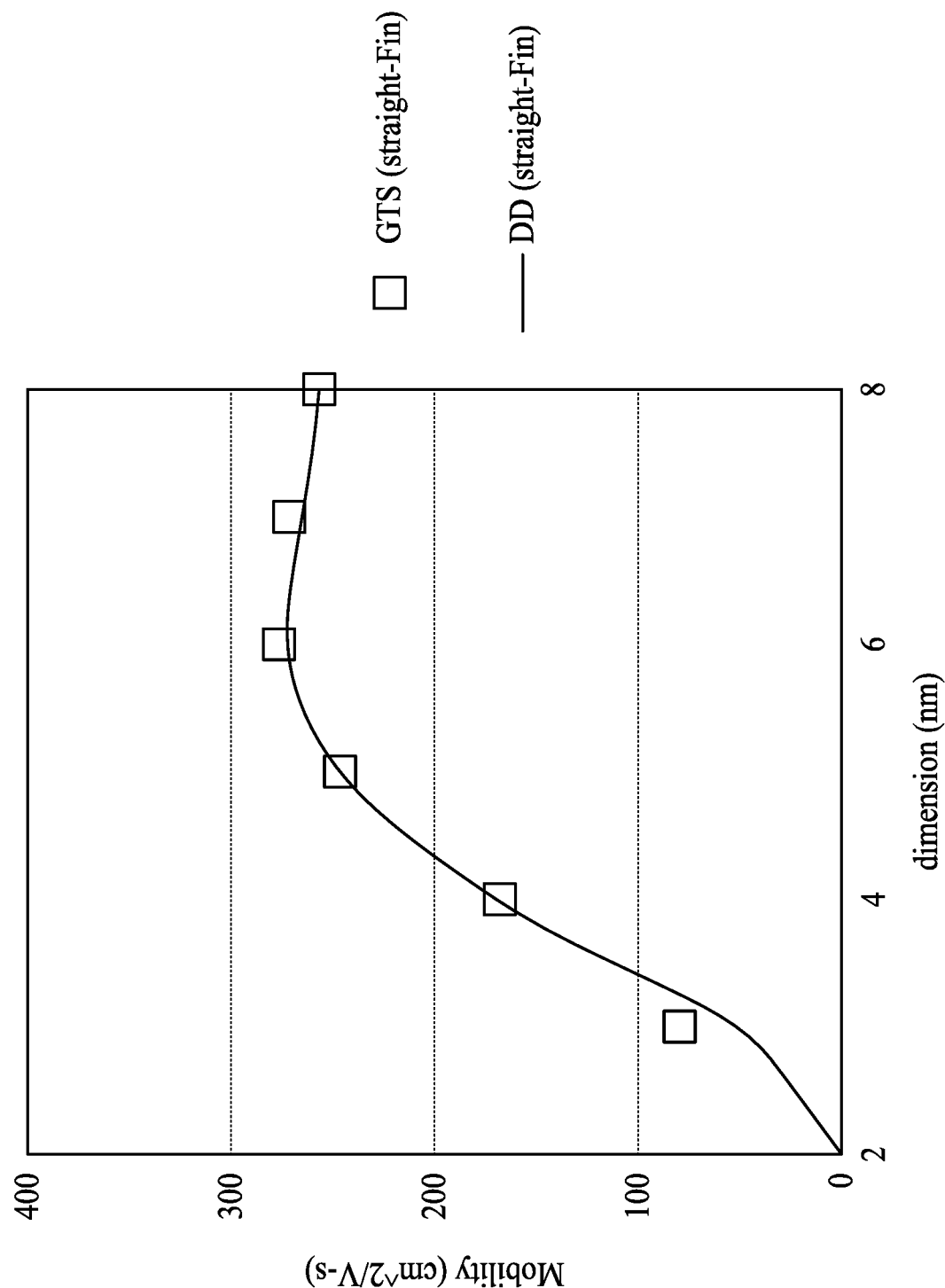
FIG. 4 is a diagram showing a relationship between electron mobility and silicon fin width, in accordance with some embodiments of the present disclosure.

Referring to FIG. 4, FIG. 4 shows a relation between electron mobility and silicon fin width. It is clear that an optimal value for preserving electron mobility is having a fin width of about 6 nm. As previously discussed, the leakage current can be reduced by changing a fin geometry to a nanowire geometry, weighting of the leakage current is reduced when determining the optimal fin width for an n-FET.

Figure 5:
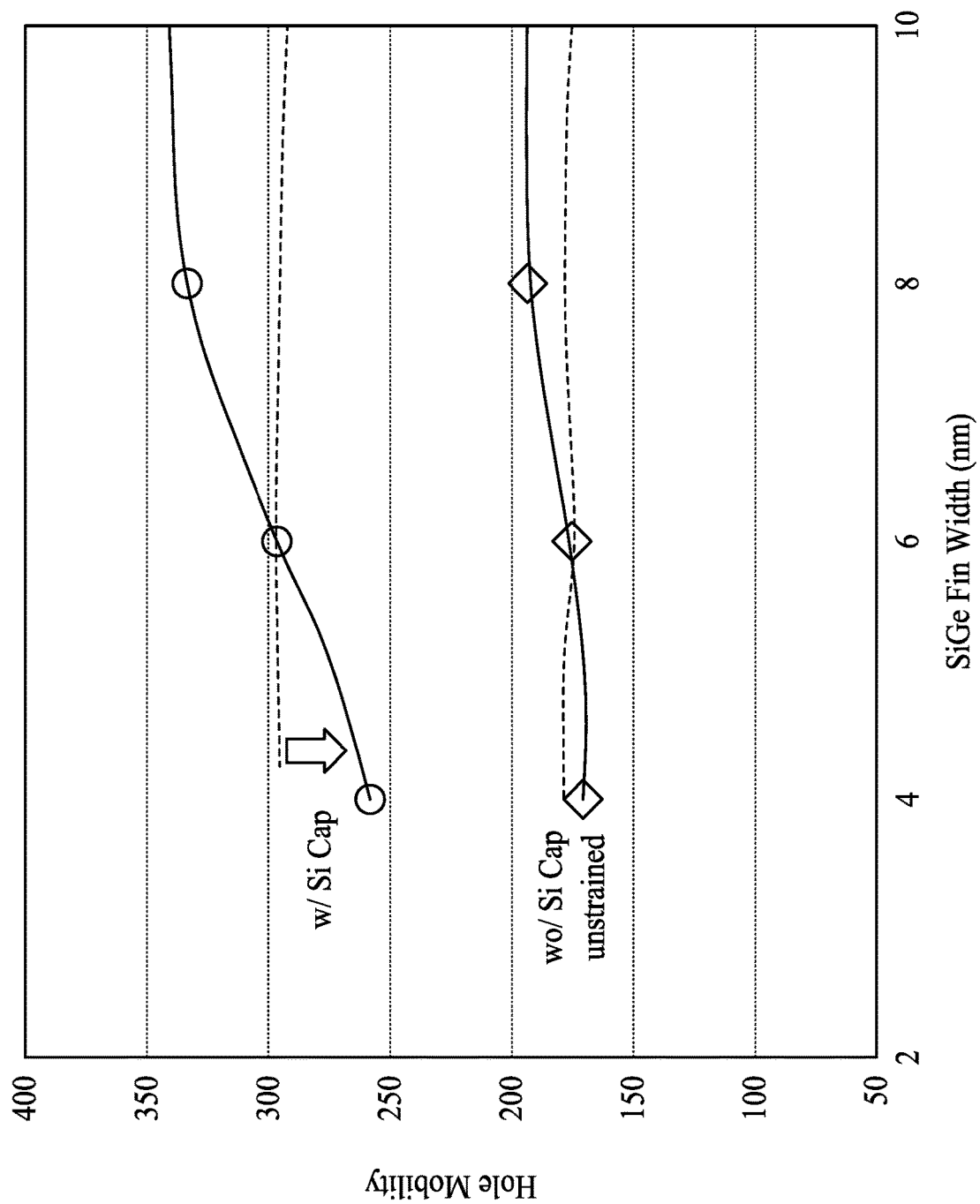
FIG. 5 is a diagram showing a relationship between hole mobility and silicon fin width, in accordance with some embodiments of the present disclosure.

Referring to FIG. 5, FIG. 5 shows a relation between hole mobility and silicon germanium fin width. Under the condition of no silicon cap, which refers to an unstrained status, hole mobility, sits at an average of about 180 $cm^2/V$-s, slightly decreases when the fin width reduces from 8 nm to 4 nm. Under the condition with silicon cap, which refers to a strained status, hole mobility, sits at an average of about 300 $cm^2/V$-s, decreases when the fin width reduces from 8 nm to 4 nm. The strained status better describe the final product of the FinFET because passivation layer over the fin generates moderate amount of stress. Considering preservation of high enough hole mobility as well as reducing leakage current, optimal fin width sits at about 4 nm for a p-FET.

Note that in the art of MuGFET, several material systems including Group III and Group V materials are currently known and shall be encompassed within the contemplated scope of present disclosure. For example, on a silicon substrate, Si nanowire for n-FET and SiGe nanowire for p-FET are normally adopted. On a GaAs substrate, GaAs nanowire for n-FET and InGaAs nanowire for p-FET are normally adopted. On a Ge/GaAs substrate, Ge nanowire for n-FET and GaAs nanowire for p-FET are normally adopted. For brevity purpose, present disclosure provides illustration and the following detailed description in Si nanowire and SiGe nanowire material system only. The same inventive concept can be applied on different semiconductor material systems are addressed.

FIG. 6A to FIG. 25D illustrate different perspectives in intermediate stages of manufacturing of the hybrid semiconductor structure described herein.

Figure 6C:
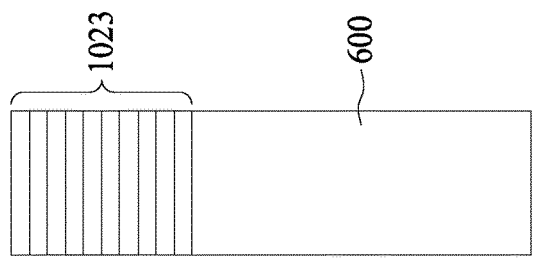
FIG. 6A to FIG. 6C are a 3D perspective view, a cross sectional view dissecting along an Y direction, and a cross sectional view dissecting along an X direction, respectively, of a type of hybrid semiconductor structure during an intermediate stage of manufacturing operations, in accordance with some embodiments of the present disclosure.
Figure 6B:
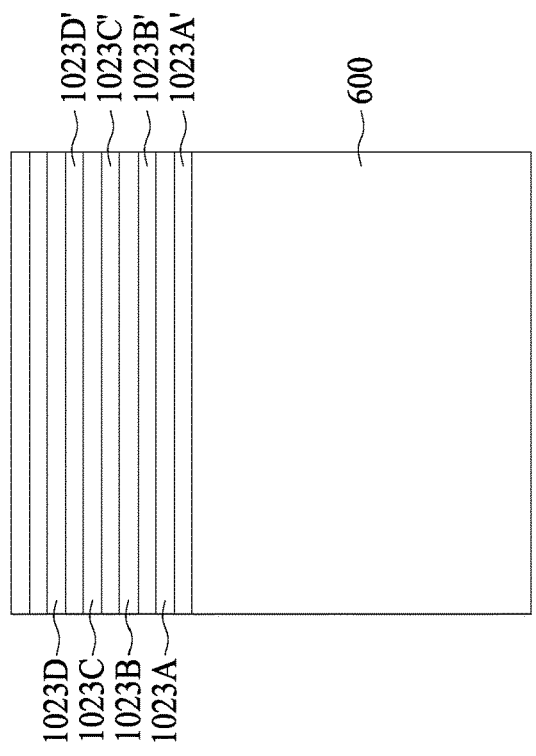
Figure 6A:
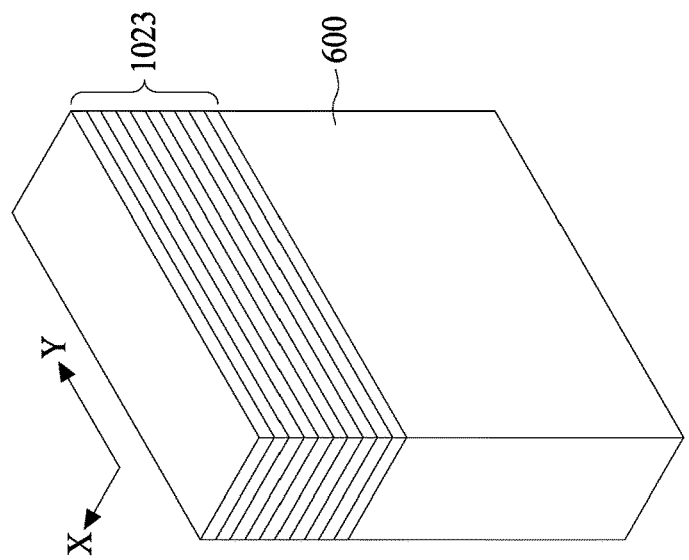

Referring to FIG. 6A to FIG. 6C, a stacked epitaxy 1023 is formed over the substrate 600. In some embodiments, the stacked epitaxy 1023 includes one or more silicon (Si) layers and one or more silicon germanium (SiGe) layers alternatingly disposed above the substrate 600. FIG. 6A is a perspective view, FIG. 6B is a Y-cut cross sectional view, and FIG. 6C is an X-cut cross sectional view. For example, the stacked epitaxy 1023 includes a first silicon germanium layer 1023A', a first silicon layer 1023A, a second silicon germanium layer 1023B', a second silicon layer 1023B, a third silicon germanium layer 1023C', a third silicon layer 1023C, a fourth silicon germanium layer 1023D', and a fourth silicon layer 1023D. It is appreciated that any number of silicon layers or silicon germanium layers can be formed.

Figures 7C, 7D:
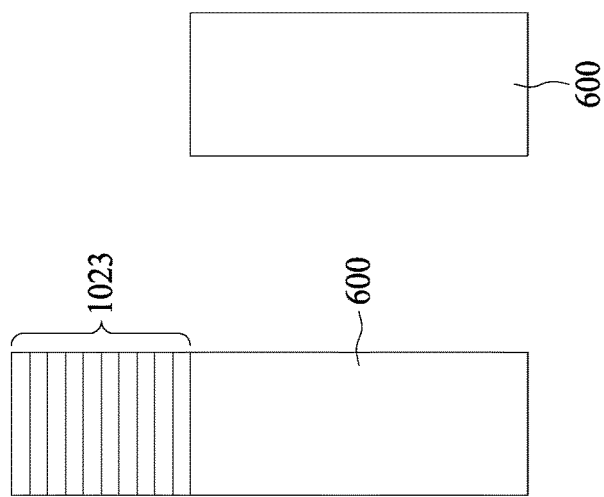
FIG. 7A to FIG. 7D are a 3D perspective view, a cross sectional view dissecting along an Y direction, a cross sectional view dissecting along an X direction at N-region, and a cross sectional view dissecting along an X direction at P-region, respectively, of a type of hybrid semiconductor structure during an intermediate stage of manufacturing operations, in accordance with some embodiments of the present disclosure.
Figure 7B:
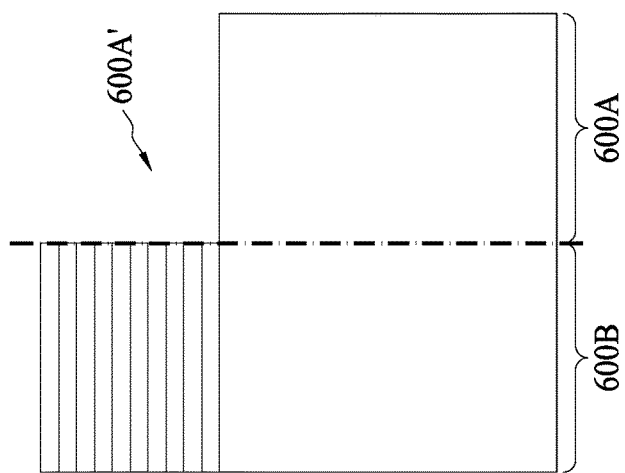
Figure 7A:
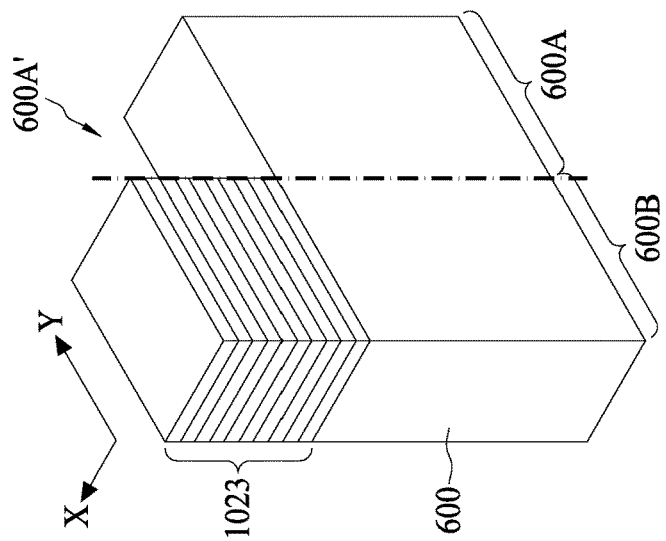

Referring to FIG. 7A to FIG. 7D, the substrate 600 includes a first transistor region 600A and a second transistor region 600B. The stacked epitaxy 1023 within the first transistor region 600A is removed, thence a trench 600A' is formed in the stacked epitaxy 1023 and the underlying substrate 600 is exposed. In some embodiments, the trench 600A' may have a vertical sidewall as previously described in FIG. 2A. In some other embodiments, the trench 600A' may have a sidewall tapering toward the substrate 600 as previously described in FIG. 3. In some embodiments, the first transistor region 600A is p-type transistor region, and the second transistor region 600B is n-type transistor region. FIG. 7A is a perspective view, FIG. 7B is a Y-cut cross sectional view, FIG. 7C is an X-cut cross sectional view at the second transistor region 600B, and FIG. 7D is an X-cut cross sectional view at the first transistor region 600A.

Figure 8A:
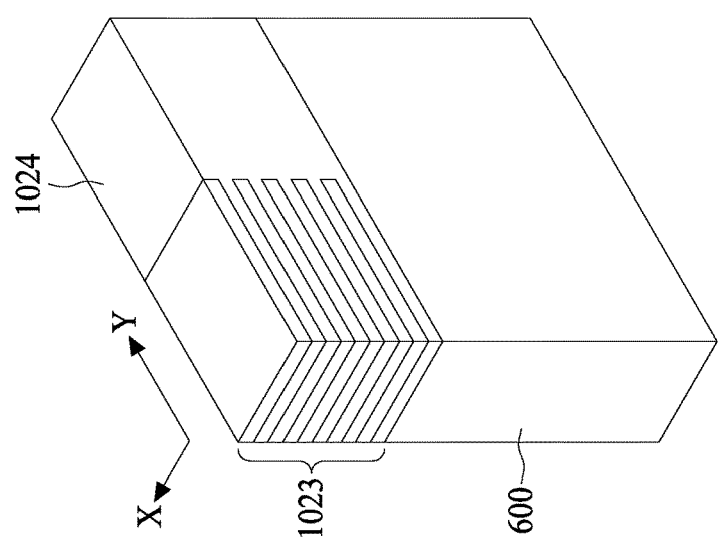
FIG. 8A to FIG. 8D are a 3D perspective view, a cross sectional view dissecting along an Y direction, a cross sectional view dissecting along an X direction at N-region, and a cross sectional view dissecting along an X direction at P-region, respectively, of a type of hybrid semiconductor structure during an intermediate stage of manufacturing operations, in accordance with some embodiments of the present disclosure.
Figure 8B:
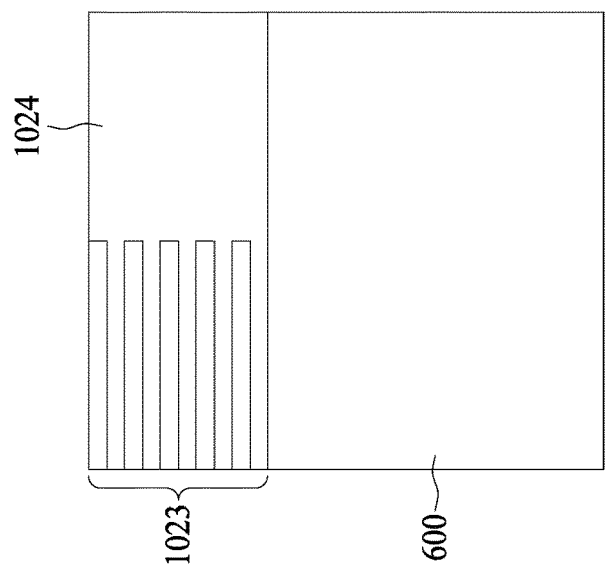
Figure 8C:
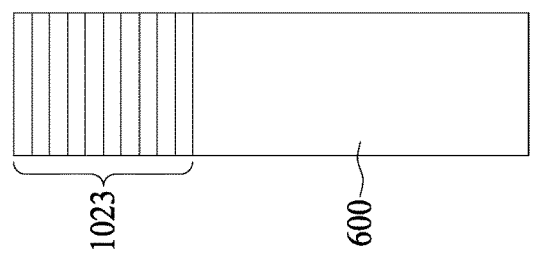
Figure 8D:
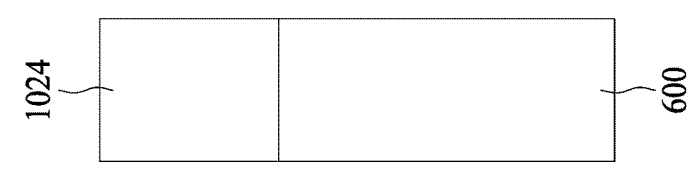

In FIG. 8A to FIG. 8D, a first layer 1024 is filled into the trench 600A' of the stacked epitaxy 1023. FIG. 8A is a perspective view, FIG. 8B is a Y-cut cross sectional view, FIG. 8C is an X-cut cross sectional view at the second transistor region 600B, and FIG. 8D is an X-cut cross sectional view at the first transistor region 600A. A material of the first layer 1024 is different from the material of the substrate 600. For example, the substrate 600 may be composed of silicon, and the first layer 1024 may be composed of silicon germanium (SiGe). In some embodiments, the stacked epitaxy 1023 may include a material of the first layer 1024, however, the material composition, for example, atomic percentage in a compound material, of the first layer 1024 may or may not be identical to that in the stacked epitaxy 1023.

In FIG. 9A to FIG. 9D, the first layer 1024 and a portion of the substrate 600 are patterned to form a first fin protruding from the substrate 600. An upper portion of the first fin is a first layer fin 1024'. The stacked epitaxy 1023 and a portion of the substrate 600 are patterned to form a second fin protruding from the substrate 600. An upper portion of the second fin is a stacked fin 1023'. FIG. 9A is a perspective view, FIG. 9B is a Y-cut cross sectional view, FIG. 9C is an X-cut cross sectional view at the second transistor region 600B, and FIG. 9D is an X-cut cross sectional view at the first transistor region 600A. In some embodiments, the first layer fin 1024' and the stacked fin 1023' are concurrently patterned under one lithography operation. A width of the first layer fin 1024' and a width of the stacked fin 1023', as patterned, may be identical. In some embodiments, the first layer fin 1024' can be a silicon germanium fin. In some embodiments, the first layer fin 1024' may subsequently form a channel for a P-type transistor. In some embodiments, the stacked fin 1023' may be composed of silicon and silicon germanium. In some embodiments, the stacked fin 1023' may form a channel for an N-type transistor. A shallow trench isolation (STI) 199 is subsequently formed between the lower portion of the first fin and the second fin.

Figure 10C:
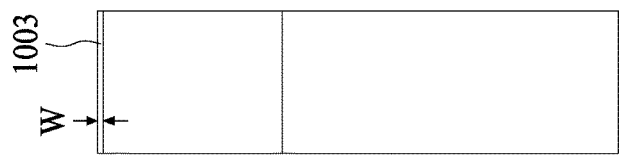
FIG. 10C, FIG. 10D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 10D:
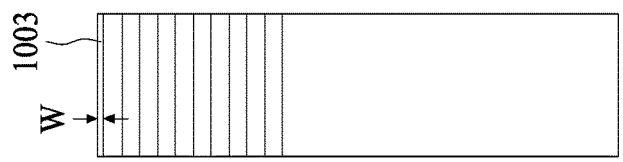
Figure 10B:
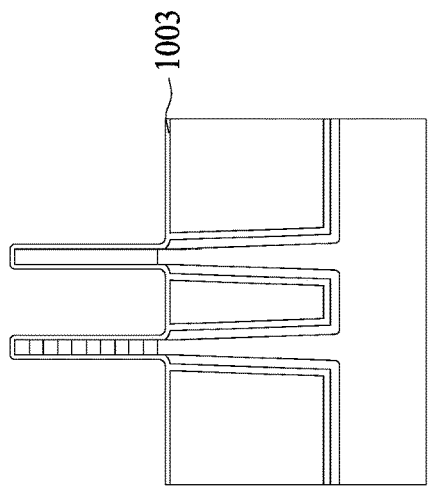
FIG. 10A, FIG. 10B, FIG. 10B'.
Figure 10B:
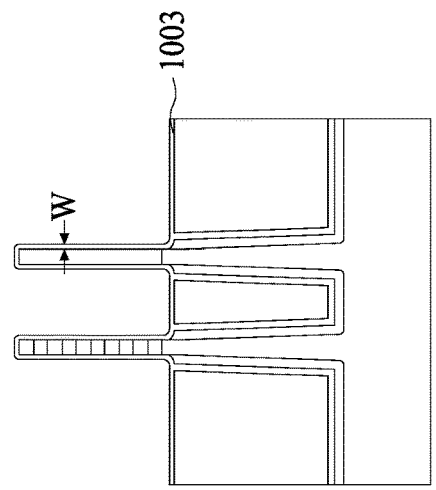
Figure 10A:
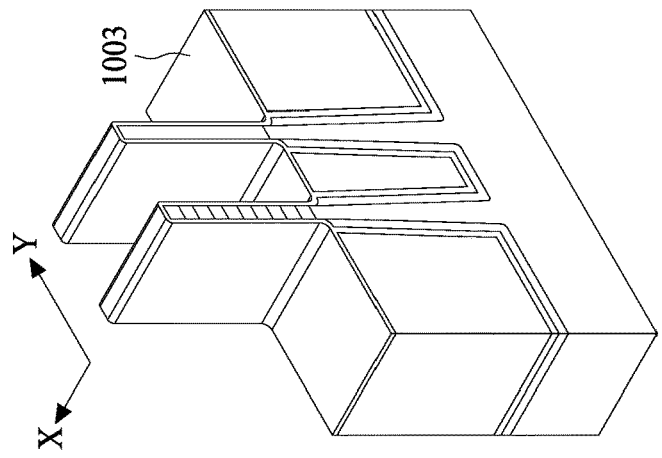

In FIG. 10A to FIG. 10D, a first dummy oxide layer 1003 is blanket formed over the first layer fin 1024' and the stacked fin 1023'. FIG. 10A is a perspective view, FIG. 10B is a Y-cut cross sectional view. FIG. 10C is an X-cut cross sectional view at the second transistor region 600B, and FIG. 10D is an X-cut cross sectional view at the first transistor region 600A. An annealing operation is optionally performed to transform the first dummy oxide layer 1003 having an as-deposited thickness to a second dummy oxide layer 1003' having an annealed thickness W. During the annealing operation, the first dummy oxide layer 1003 reacts with the first layer fin 1024' and the stacked fin 1023', oxidizing materials of the first layer fin 1024' and the stacked fin 1023'. As a result, annealed thickness W of the second dummy oxide layer 1003' is greater than the as-deposited thickness of the first dummy oxide layer 1003. In subsequent operations illustrated in FIG. 21A to FIG. 21D, the second dummy oxide layer 1003' is removed, exposing a post-annealed first layer fin 1024' and a post-annealed stacked fin 1023' having narrower widths compared to the as-patterned counterparts.

In some embodiments, when the as-patterned first layer fin 1024' composing silicon germanium is having a first germanium concentration, the annealed first layer fin 1024' would then compose silicon germanium which has a second germanium concentration greater than the first germanium concentration due to the fact that the oxidation process consumes silicon in a faster rate than that to germanium, germanium at the surface of first layer fin 1024' is then expelled and concentrated in the portion of the first layer fin 1024' not being oxidized. The aforesaid germanium condensation operation can be optionally performed to increase the germanium concentration in the first layer fin 1024' as-patterned.

Figure 11D:
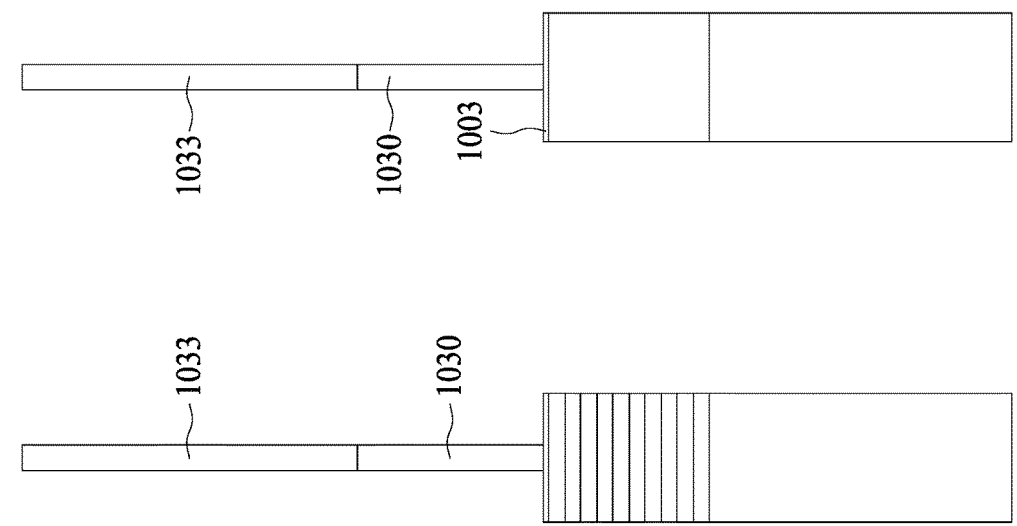
FIG. 11C, FIG. 11D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 11C:
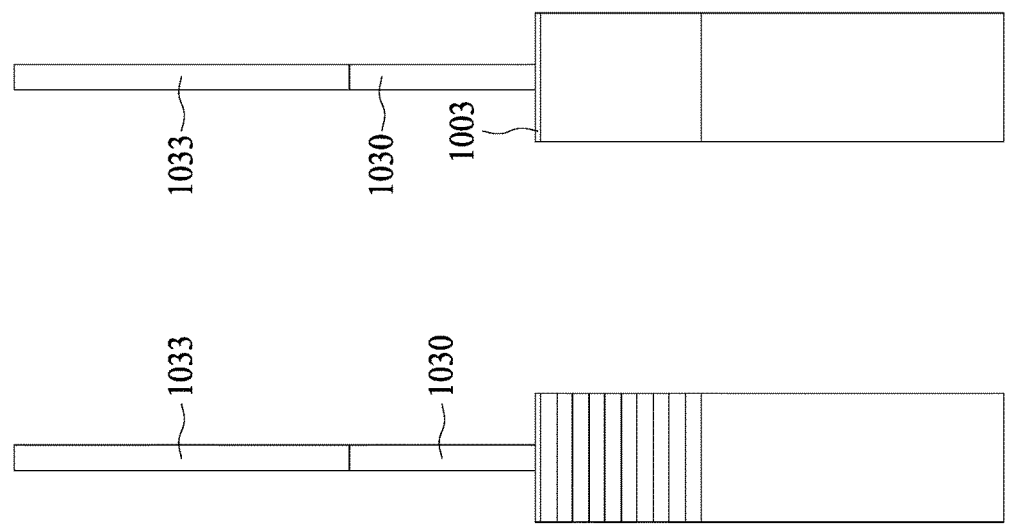
Figure 11B:
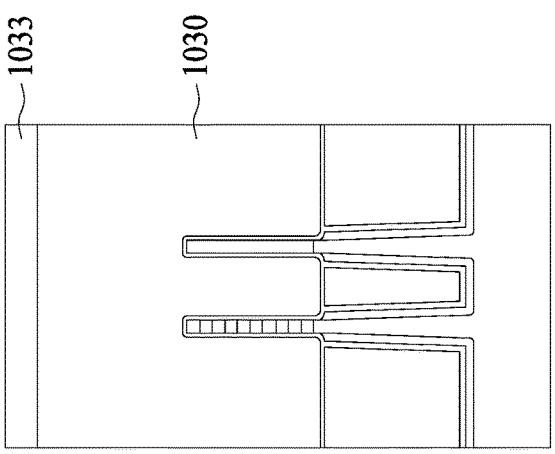
FIG. 11A, FIG. 11B, FIG. 11B'.
Figure 11B:
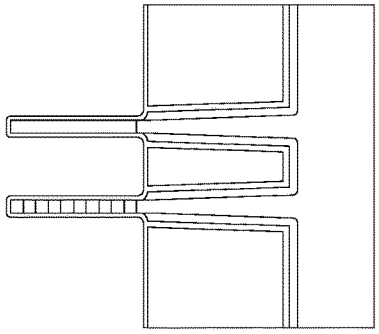
Figure 11A:
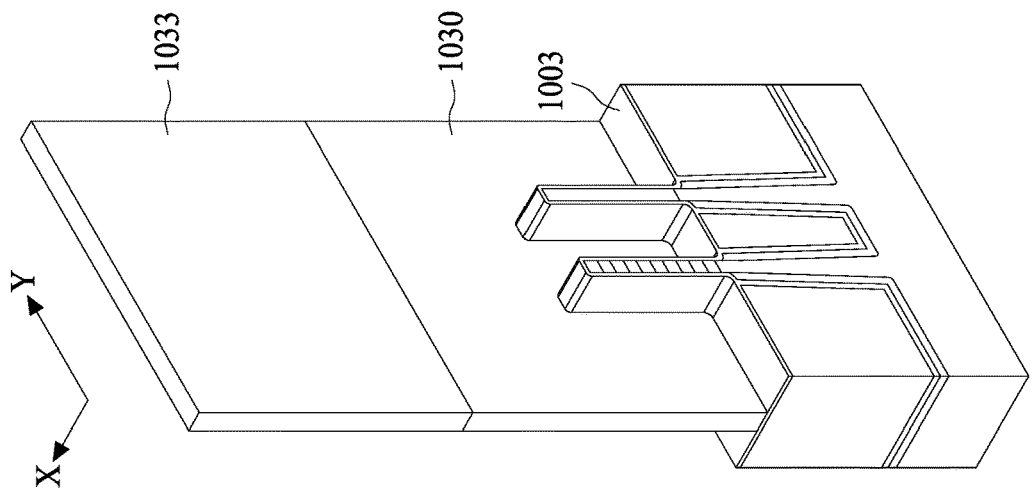

Referring to FIG. 11A to FIG. 11D, a dummy gate 1030 is orthogonally formed over a channel region of the first layer fin 1024' and the stacked fin 1023', by a subsequent patterning operation using a hardmask 1033, after the formation of the first dummy oxide layer 1003. FIG. 11A is a perspective view, FIG. 11B is a Y-cut cross sectional view, FIG. 11C is an X-cut cross sectional view at the second transistor region 600B, and FIG. 11D is an X-cut cross sectional view at the first transistor region 600A. In the illustration of FIG. 11A to FIG. 11D, the germanium condensation operations previously discussed is not performed. The dummy gate 1030 is a sacrificial gate, such as a poly gate formed by a patterning technique. As shown in FIG. 11A, the dummy gate 1030 is not directly contacting the first layer fin 1024' and the stacked fin 1023' but is in direct contact with the first dummy oxide layer 1003.

Figure 12D:
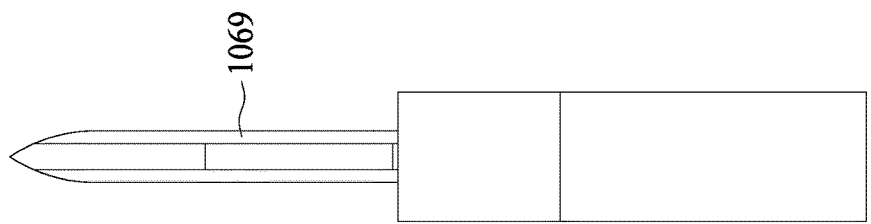
FIG. 12C, FIG. 12D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 12C:
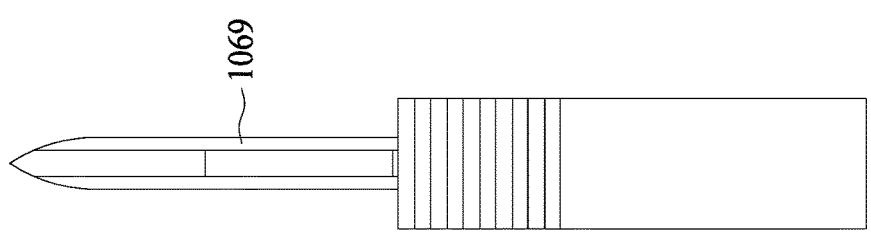
Figure 12B:
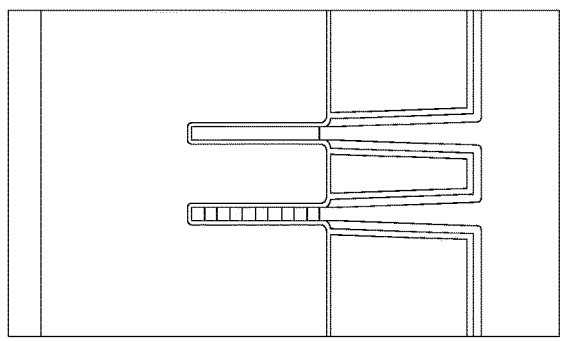
FIG. 12A, FIG. 12B, FIG. 12B'.
Figure 12B:
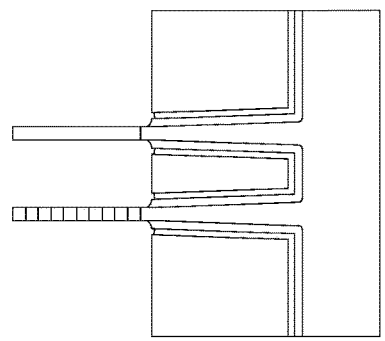
Figure 12A:
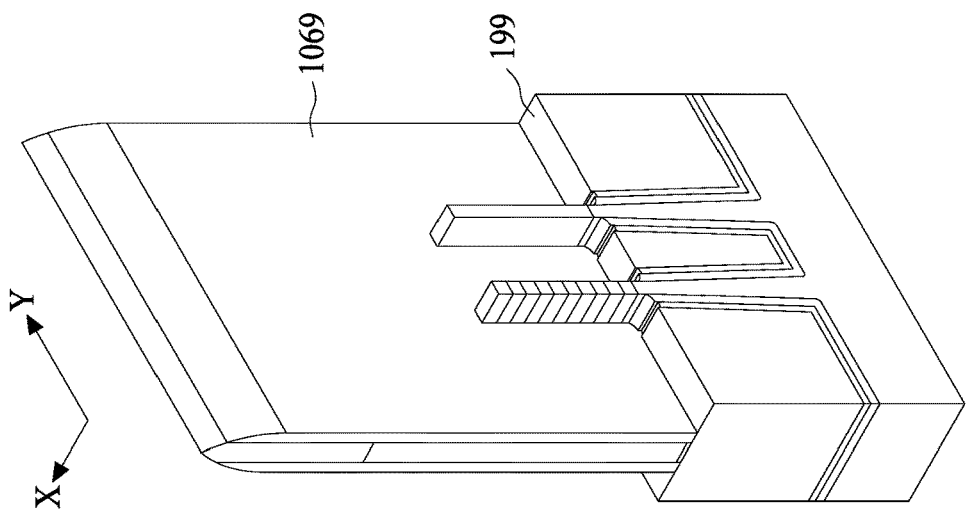

In FIG. 12A to FIG. 12D, a dummy gate spacer 1069 is conformably deposited over the hardmask 1033, the first dummy oxide layer 1003, as well as onto the sidewall of the dummy gate 1030 and the hardmask 1033. FIG. 12A is a perspective view, FIG. 12B is a Y-cut cross sectional view, FIG. 12C is an X-cut cross sectional view at the second transistor region 600B, and FIG. 12D is an X-cut cross sectional view at the first transistor region 600A. In some embodiments, the dummy gate spacer 1069 over top surfaces of the hardmask 1033 and the top surface of the first dummy oxide layer 1003 is removed by an etch operation. In some embodiments, the first dummy oxide layer 1003 not masked by the dummy gate 1030 is subsequently removed, while only the portion of the first dummy oxide layer 1003 under the dummy gate 103 is remained after the oxide etching operation.

Referring to FIG. 13A to FIG. 13D, a masking layer 1055 is patterned over the first transistor region 600A to cover the first layer fin 1024' while exposing the second transistor region 600A and the staked fin 1023'. FIG. 13A is a perspective view, FIG. 13B is a Y-cut cross sectional view, FIG. 13C is an X-cut cross sectional view at the second transistor region 600B, and FIG. 13D is an X-cut cross sectional view at the first transistor region 600A. The masking layer 1055 may protect the first layer fin 1024' in the subsequent nanowire release operation in the source/drain region.

In FIG. 14A to FIG. 14D, a selective etch is performed to partially remove, for example, germanium layers 1023A', 1023B', 1023C', and 1023D' in the stacked fin 1023', while maintaining little to no removal of the silicon layers 1023A, 1023B, 1023C, and 1023D, As a result, a Si nanowire structure 1023" is released from the stacked fin 1023' at the source/drain region, while the SiGe stacks at the channel region of the stacked fin is protected under the dummy gate 1030 and the dummy gate spacer 1069.

Figure 15D:
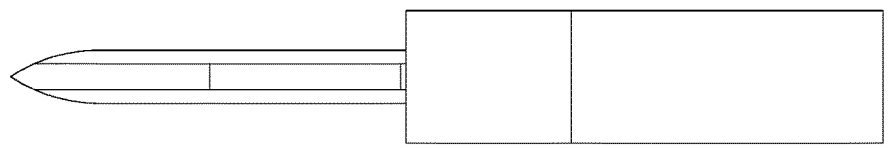
FIG. 15C, FIG. 15D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 15C:
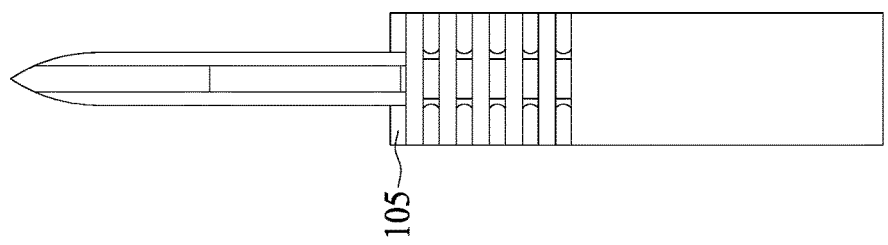
Figure 15B:
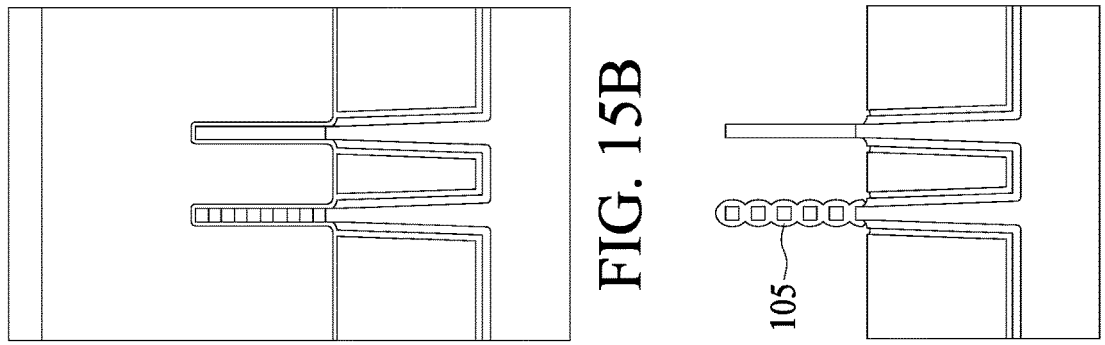
FIG. 15A, FIG. 15B, FIG. 15B'.
Figure 15B:
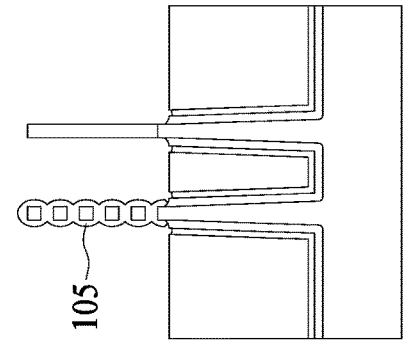
Figure 15A:
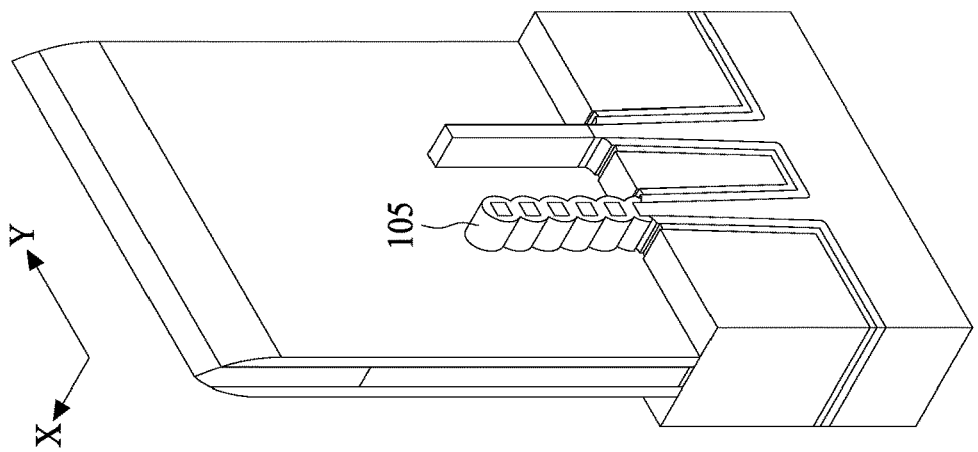

FIG. 14A is a perspective view, FIG. 14B is a Y-cut cross sectional view, FIG. 14C is an X-cut cross sectional view at the second transistor region 600B, and FIG. 14D is an X-cut cross sectional view at the first transistor region 600A. The released portions of the silicon stacks within the Si nanowire structure 1023" are thence free standing with respect to each other. Subsequently, an inner spacer 106 is laterally deposited onto a faceted surface of the remaining SiGe stacks within the channel region. In FIG. 15A to FIG. 15D, a first source/drain 105 is formed through an epitaxial growth technique around as well as over the exposed Si nanowire structure 1023". FIG. 15A is a perspective view, FIG. 15B is a Y-cut cross sectional view, FIG. 15C is an X-cut cross sectional view at the second transistor region 600B, and FIG. 15O is an X-cut cross sectional view at the first transistor region 600A. In some embodiments, the first source/drain 105 is formed to create a Si nanowire NFET. In some embodiments, the first source/drain 105 is composed of SiP, or the like. The masking layer 1055 is removed to expose the first layer fin 1024' for subsequent operations.

Figure 16D:
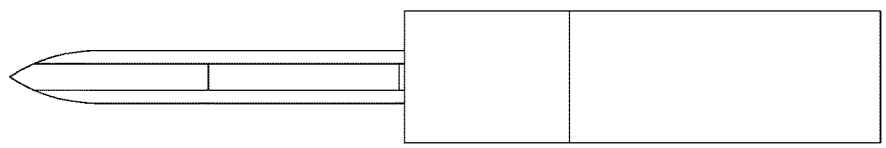
FIG. 16C, FIG. 16D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 16C:
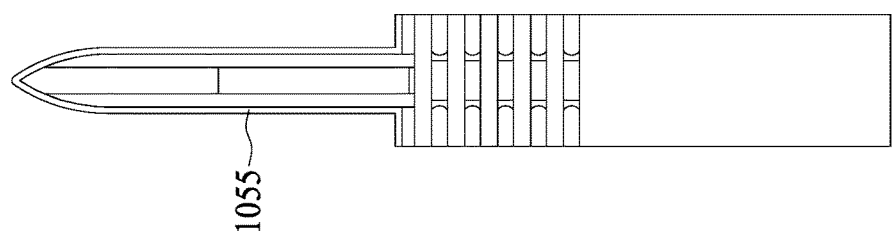
Figure 16B:
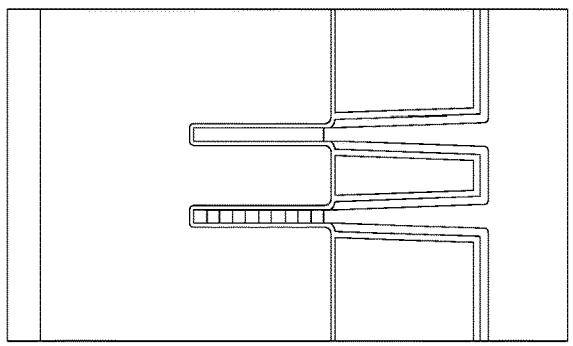
FIG. 16A, FIG. 16B, FIG. 16B'.
Figure 16B:
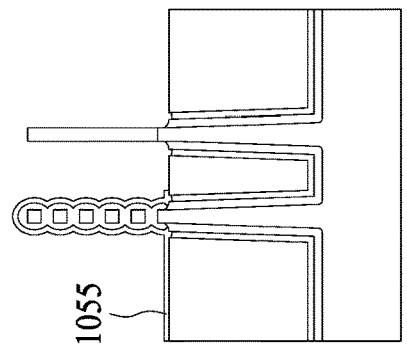
Figure 16A:
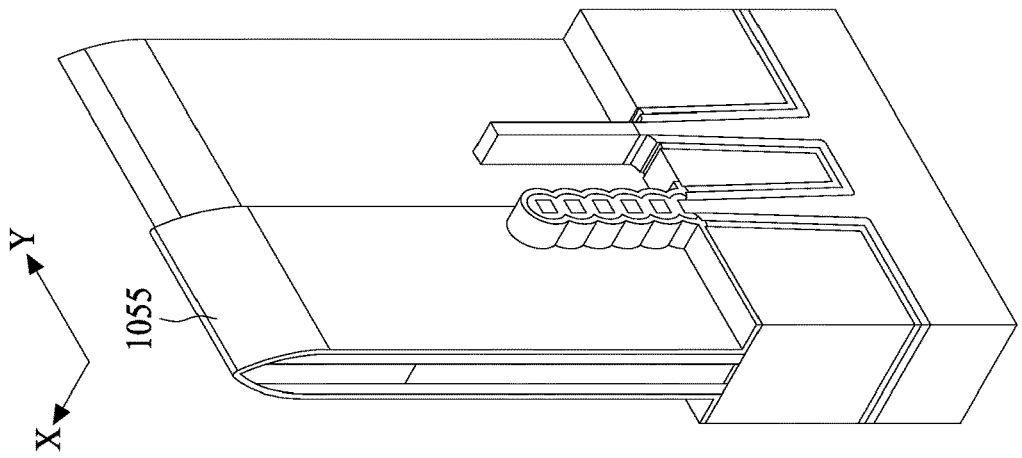
Figure 17D:
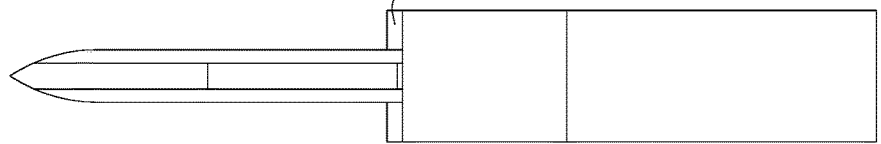
FIG. 17C, FIG. 17D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 17C:
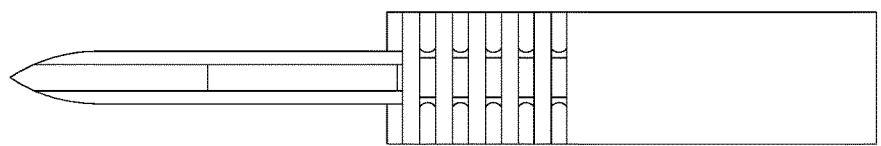
Figure 17B:
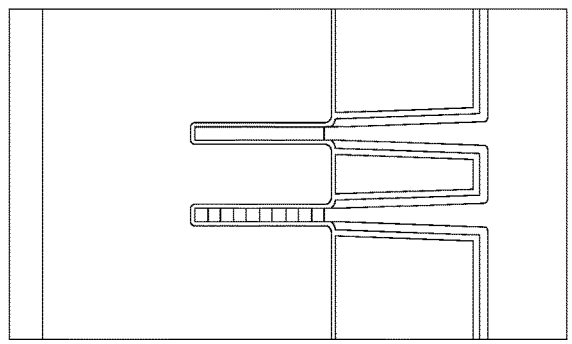
FIG. 17A, FIG. 17B, FIG. 17B'.
Figure 17B:
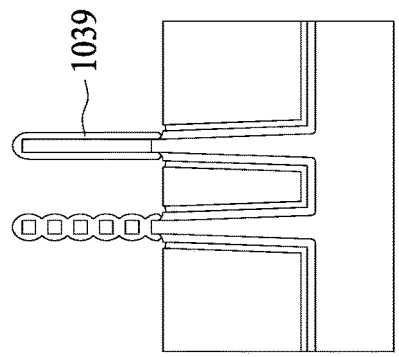
Figure 17A:
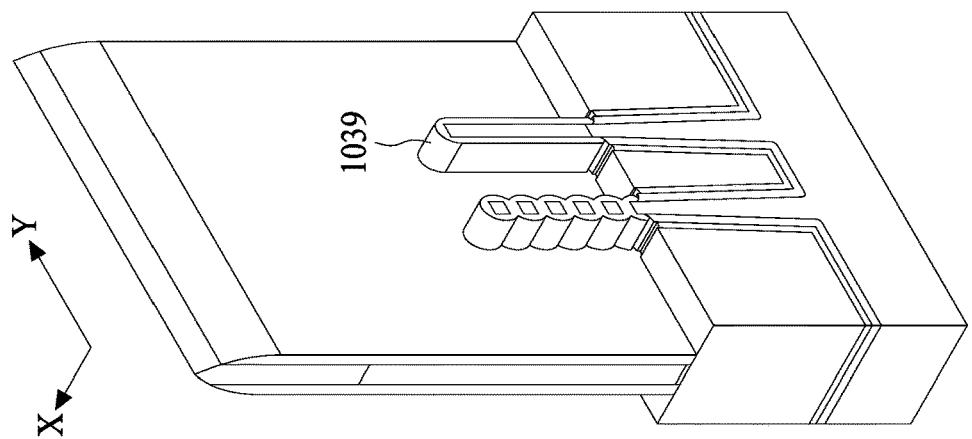
Figure 18D:
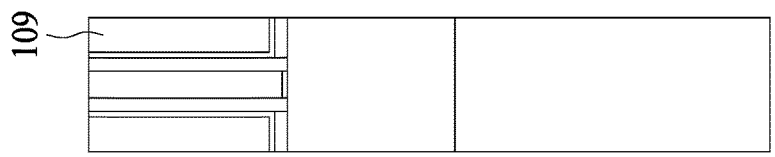
FIG. 18C, FIG. 18D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 18C:
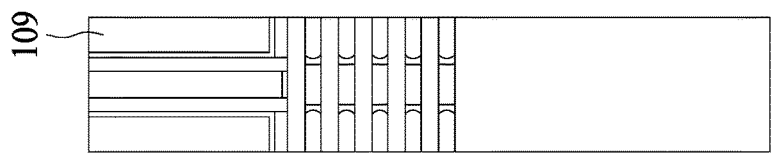
Figure 18B:
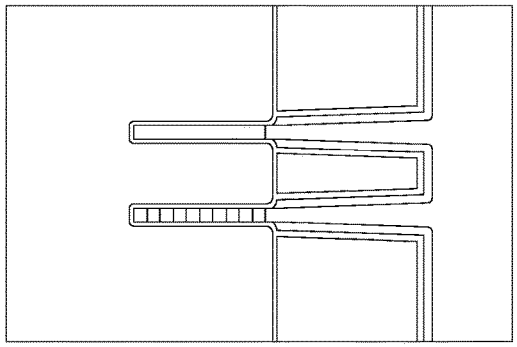
FIG. 18A, FIG. 18B, FIG. 18B'.
Figure 18B:
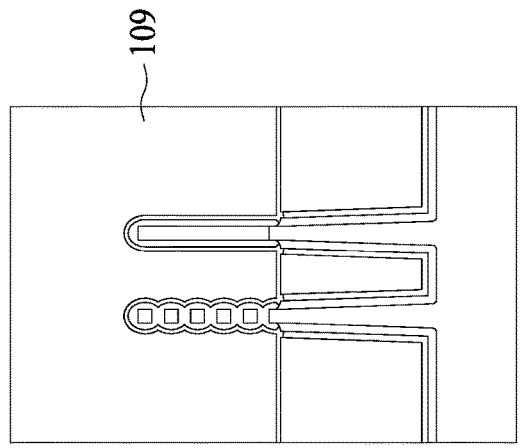
Figure 18A:
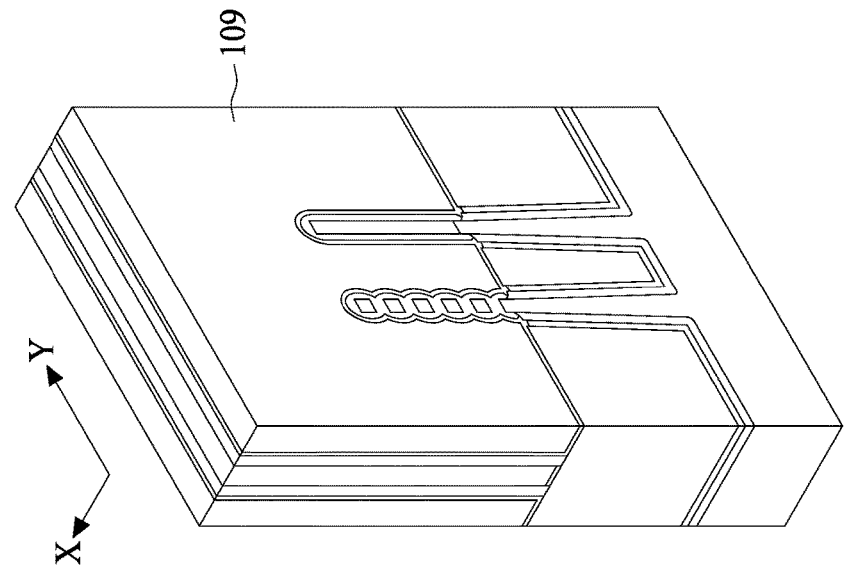

Referring to FIG. 16A to FIG. 16O, a masking layer 1055 is patterned aver the second transistor region 600B to cover the Si nanowire structure at the source/drain region. The masking layer 1055 may protect the exposed Si nanowire structure 1023" at the source/drain region in the subsequent source/drain formation at the first layer fin 1024'. In FIG. 17A to FIG. 17D, a second source/drain 1039 is conformably formed over the first layer fin 1024'. In some embodiments, the second source/drain 1039 is formed through an epitaxial growth technique to create a silicon germanium nanowire PFET. In some embodiments, the second source/drain 1039 is composed of boron-doped SiGe (SiGeB).

Figure 19D:
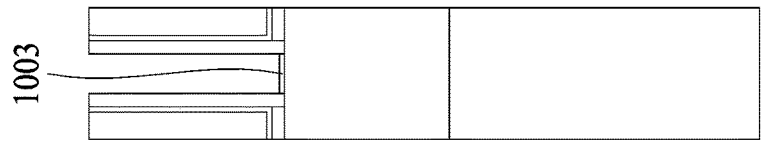
FIG. 19C, FIG. 19D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 19C:
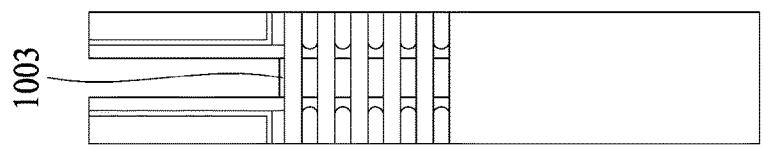
Figure 19B:
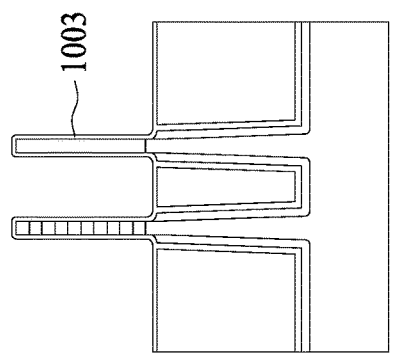
FIG. 19A, FIG. 19B, FIG. 19B'.
Figure 19B:
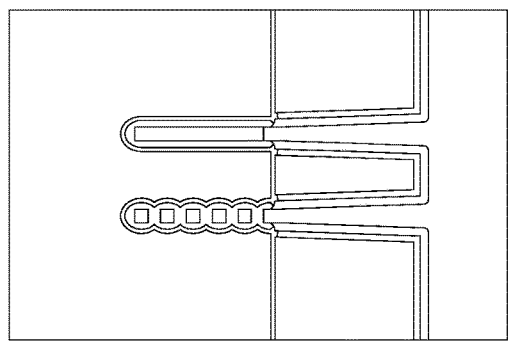
Figure 19A:
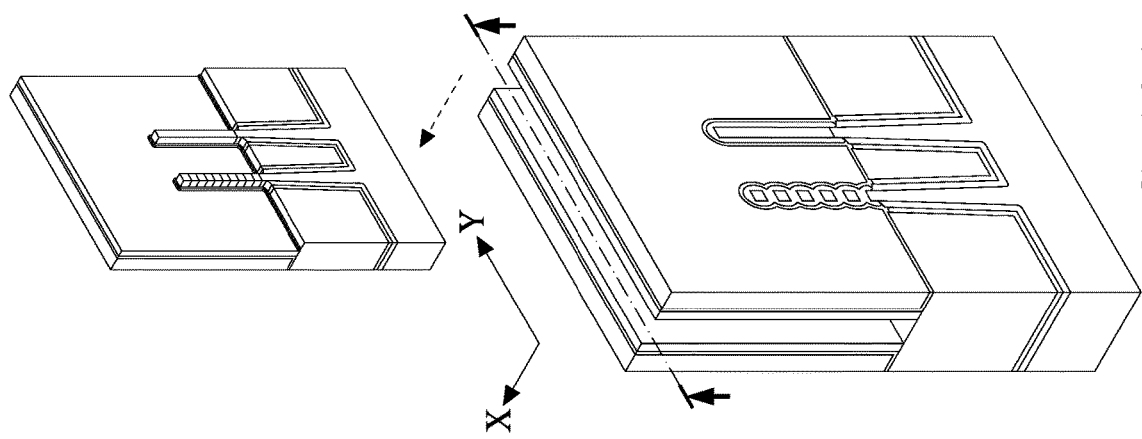

Referring to FIG. 18A to FIG. 18D, an interlayer dialectic (ILD) 109 is formed over the first transistor region 600A and the second transistor region 600B to cover the first source/drain 105 and the second source/drain 1039. A chemical mechanical planarization (CMP) operation is subsequently performed to remove the hardmask 1033 and co-planarize the dummy gate 1030, the dummy gate spacer 1069, and the ILD 109. In some embodiments, the CMP operation stops at a position above both first source/drain 105 and second source drain 1039. In FIG. 19A to FIG. 19O, the dummy gate 1030 is removed, exposing the first dummy oxide layer 1003 deposited previously as illustrated in FIG. 10A to FIG. 10D.

Figure 20D:
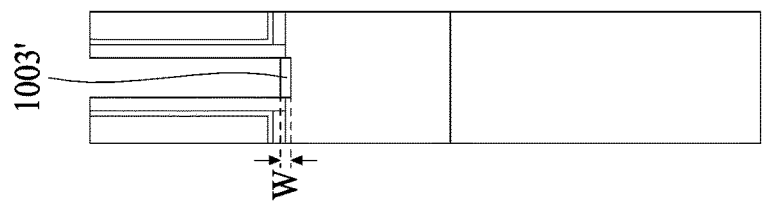
FIG. 20C, FIG. 20D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 20C:
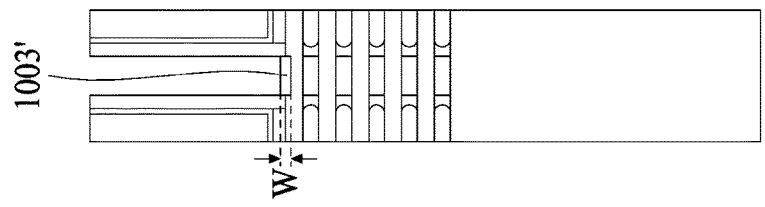
Figure 20B:
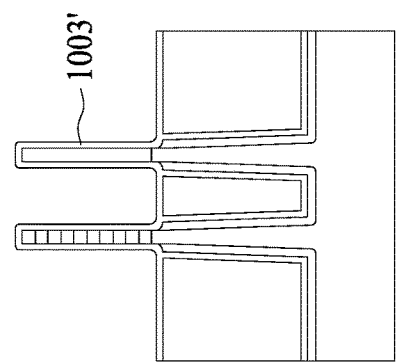
FIG. 20A, FIG. 20B, FIG. 20B'.
Figure 20B:
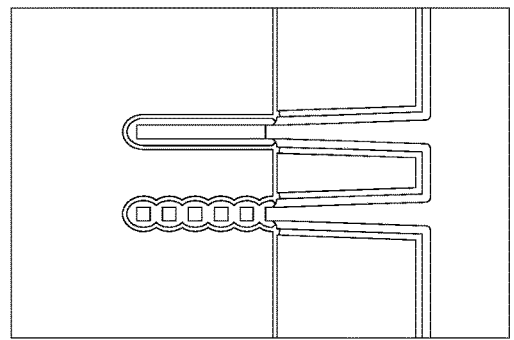

In FIG. 20A to FIG. 20D, FIG. 20A is a perspective view, FIG. 20B is a Y-cut cross sectional view, FIG. 20C is an X-cut cross sectional view at the second transistor region 600B, and FIG. 20D is an X-cut cross sectional view at the first transistor region 600A. An annealing operation is optionally performed to transform the first dummy oxide layer 1003 having an as-deposited thickness to a second dummy oxide layer 1003' having an annealed thickness W. During the annealing operation, the first dummy oxide layer 1003 reacts with the first layer fin 1024' and the stacked fin 1023', oxidizing materials of the first layer fin 1024' and the stacked fin 1023'. As a result, annealed thickness W of the second dummy oxide layer 1003' is greater than the as-deposited thickness of the first dummy oxide layer 1003. In subsequent operations illustrated in FIG. 21A to FIG. 21D, the second dummy oxide layer 1003' is removed, exposing a post-annealed first layer fin 1024' and a post-annealed stacked fin 1023' having narrower widths compared to the as-patterned counterparts.

In some embodiments, when the as-patterned first layer fin 1024' composing silicon germanium is having a first germanium concentration, the annealed first layer fin 1024' would then compose silicon germanium which has a second germanium concentration greater than the first germanium concentration due to the fact that the oxidation process consumes silicon in a faster rate than that to germanium, germanium at the surface of first layer fin 1024' is then expelled and concentrated in the portion of the first layer fin 1024' not being oxidized. The aforesaid germanium condensation operation can be optionally performed to increase the germanium concentration in the first layer fin 1024' as-patterned.

Figure 20A:
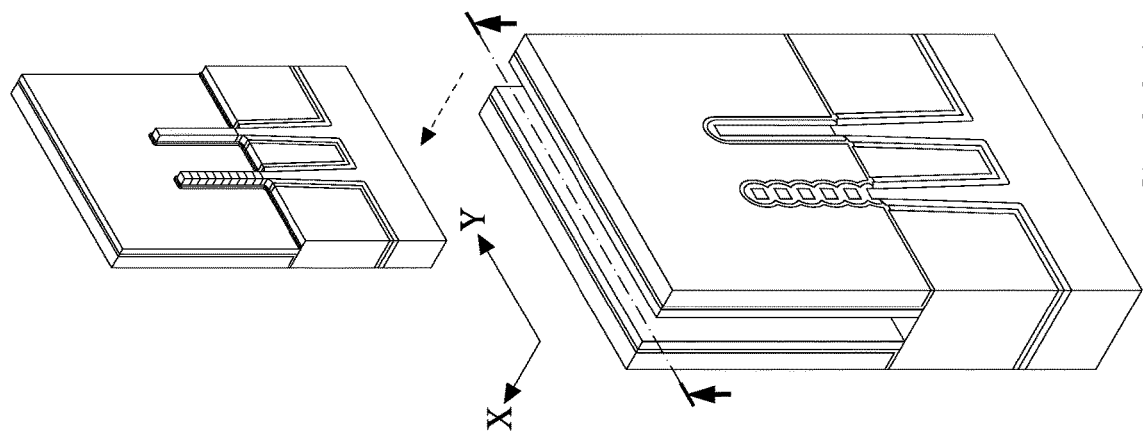
Figure 21D:
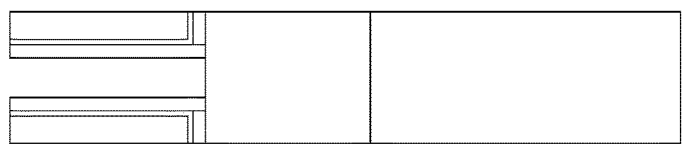
FIG. 21C, FIG. 21D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 21C:
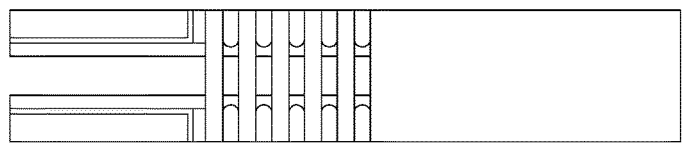
Figure 21B:
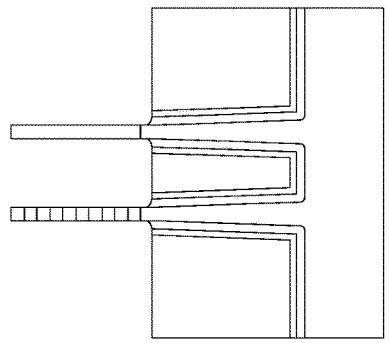
FIG. 21A, FIG. 21B, FIG. 21B'.
Figure 21B:
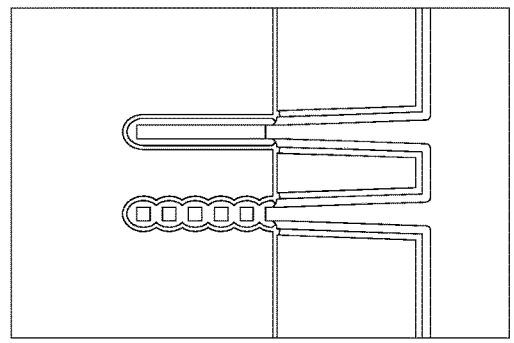
Figure 21A:
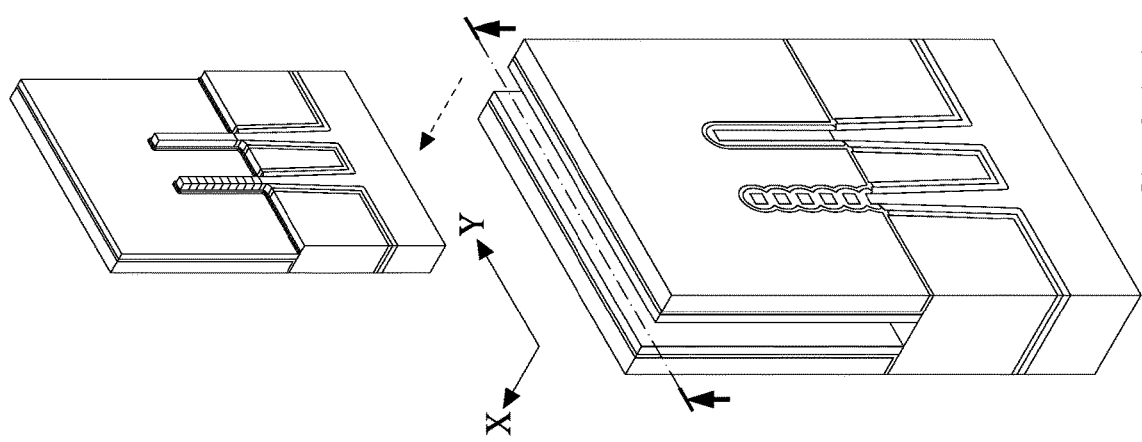
Figure 22D:
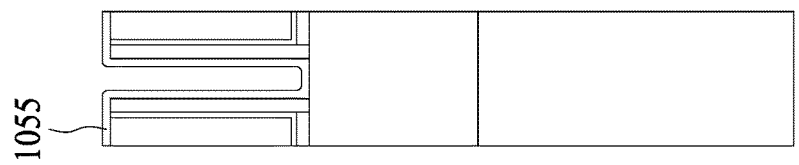
FIG. 22C, FIG. 22D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 22C:
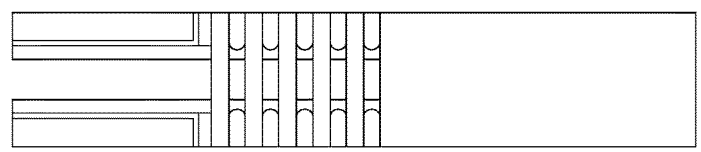
Figure 22B:
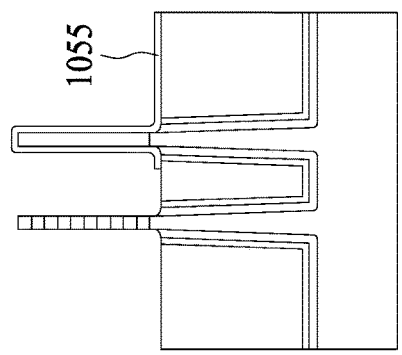
FIG. 22A, FIG. 22B, FIG. 22B'.
Figure 22B:
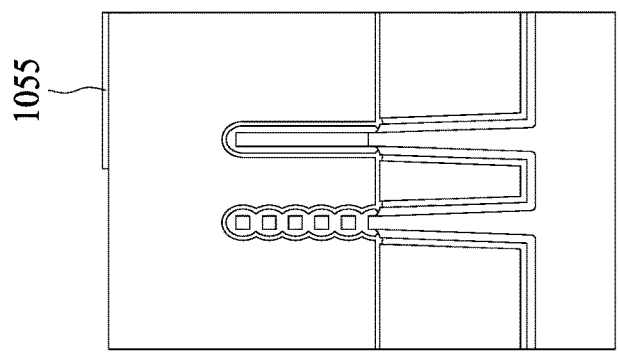
Figure 22A:
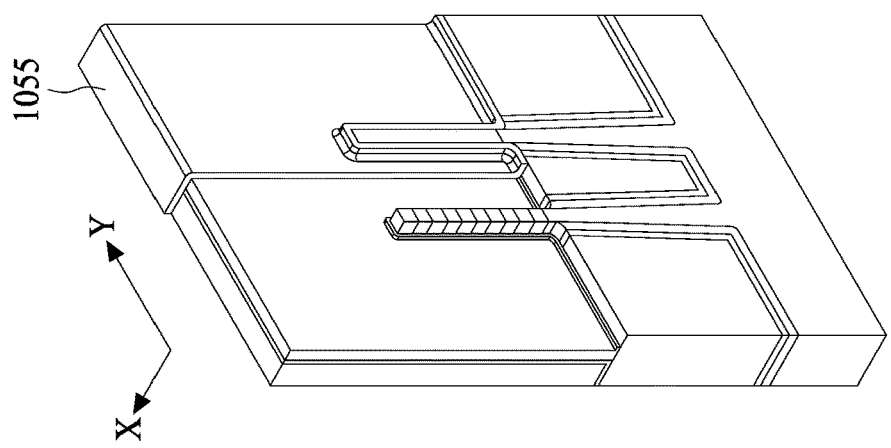
Figure 23D:
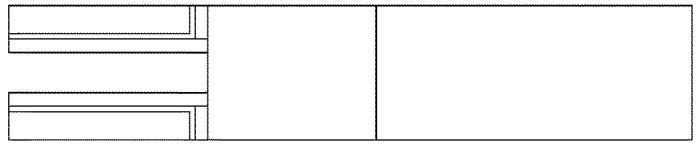
FIG. 23C, FIG. 23D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 23C:
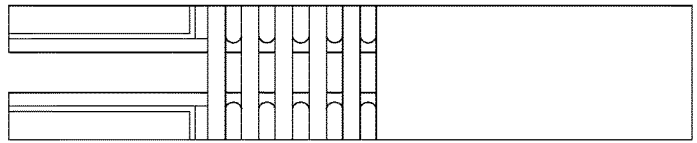
Figure 23B:
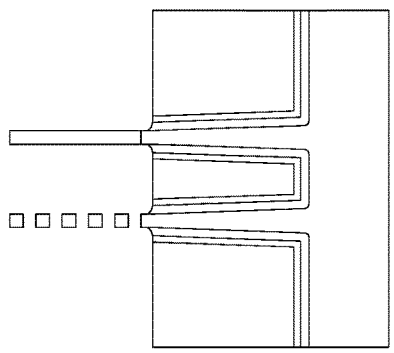
FIG. 23A, FIG. 23B, FIG. 23B'.
Figure 23B:
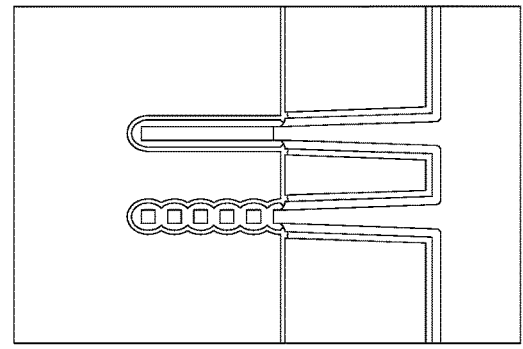
Figure 23A:
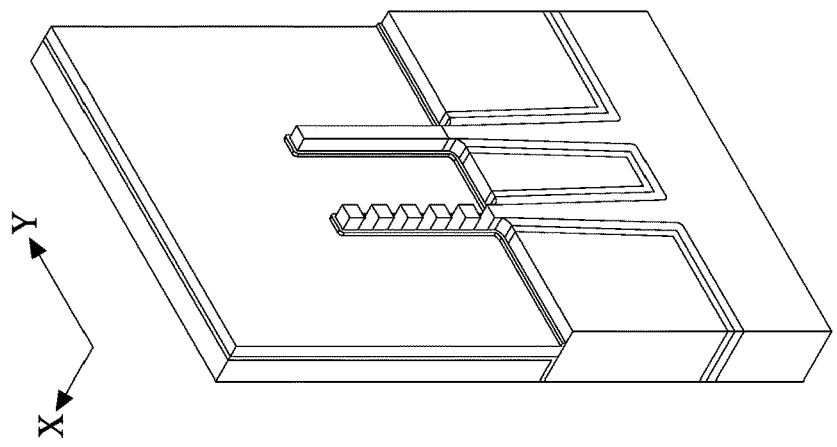
Figure 24D:
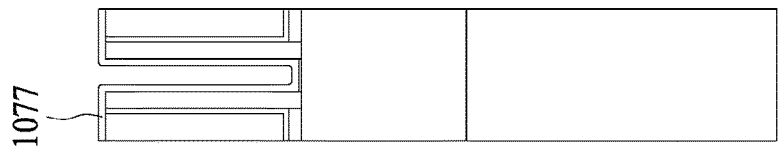
FIG. 24C, FIG. 24D are a 3D perspective view, a cross sectional view dissecting along an Y direction on gate, a cross sectional view dissecting along an Y direction on source/drain region, a cross sectional view dissecting along an X direction at N-region, a cross sectional view dissecting along an X direction at P-region, respectively, of a type of hybrid semiconductor structure during an intermediate stage of manufacturing operations, in accordance with some embodiments of the present disclosure.
Figure 24C:
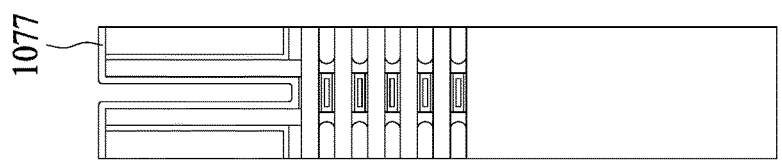
Figure 24B:
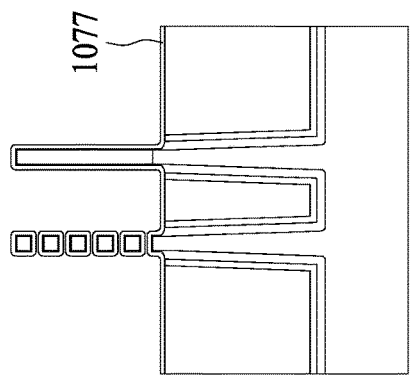
FIG. 24A, FIG. 24B, FIG. 24B'.
Figure 24B:
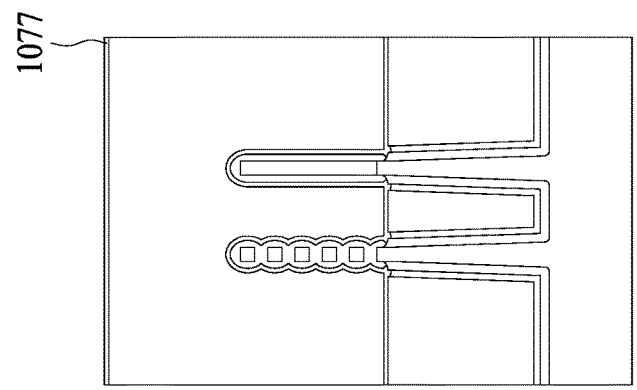
Figure 24A:
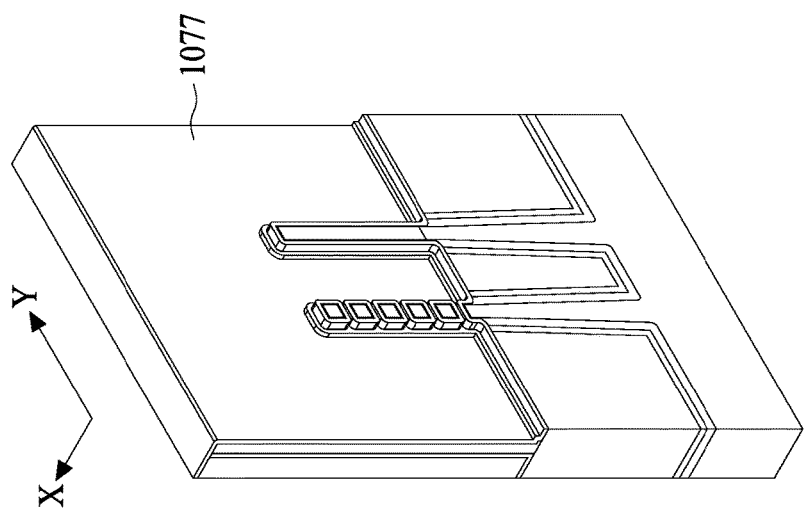

Differences between FIG. 20A and FIG. 10A lie in that, by conducting the annealing or oxidizing operation at the stage illustrated in FIG. 20A, the conversion of the first dummy oxide layer 1003 to the second dummy oxide layer 1003' takes place while only the channel region is exposed to oxide, however, by conducting the annealing or oxidizing operation at the stage illustrated in FIG. 10A, the conversion of the first dummy oxide layer 1003 to the second dummy oxide layer 1003' takes place while only the source/drain region is exposed to oxide. In some embodiments, the annealing or oxidizing operation is conducted in one of the aforesaid stages.

In FIG. 22A to FIG. 22D, a masking layer 1055 is patterned above the first transistor region 600A to cover the first layer fin 1024' tier subsequent Si nanowire release operation at the channel region. Note FIG. 22A, FIG. 23A, FIG. 24A, and FIG. 25A illustrate perspective views of the hybrid semiconductor structure by dissecting at the channel region, in order to better show the fin structure at the channel region during the aforesaid intermediate stages.

In FIG. 23A to FIG. 23D, silicon germanium in the stacked fin 1023' in the channel region of the second transistor region 600B is removed and the Si nanowires in the channel region of the second transistor region 600B is released and are free-standing with respect to each other. After Si nanowire in the channel region of the second transistor region 600A is released, the masking layer 1055 covering the first transistor region 600B is removed. In FIG. 24A to FIG. 24D, a high-k/interlayer dielectric 1077 is conformally deposited above the first transistor region 600A and the second transistor region 600B for subsequent replacement gate operations. In FIG. 25A to FIG. 25D, metal gate material 1087 is filled in the channel region and in the space between the adjacent released nanowires. The gate material 1087 is subsequently planarized by a CMP operation. In some embodiments, gate material may include, a titanium nitride capping layer, a work function metal layer, tungsten gate metal, or the like that can be formed around as well as over the plurality of released Si nanowires within the channel region.

Some embodiments of the present disclosure provide a hybrid semiconductor transistor structure, including a substrate, a first transistor on the substrate, a channel of the first transistor including a fin and having a first channel height, a second transistor adjacent to the first transistor, a channel of the second transistor including a nanowire, and a separation laterally spacing the fin from the nanowire. The first channel height is greater than the separation.

Some embodiments of the present disclosure provide a method for manufacturing a semiconductor structure, including (1) providing a substrate; (2) epitaxially forming alternating stacked films over the substrate; (3) forming a trench in the alternating stacked films over a first transistor region; and (4) patterning the alternating stacked films over a second transistor region to obtain an alternating stacked fin.

Some embodiments of the present disclosure provide a method for manufacturing a semiconductor structure, including (1) providing a substrate; (2) epitaxially forming alternating stacked films over the substrate and in a p-type transistor region and an n-type transistor region; (3) forming a trench in the alternating stacked films in the p-type transistor region; and (4) patterning the alternating stacked films over the n-type transistor region to obtain an alternating stacked fin.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to

What is claimed is:

1. A method for forming a hybrid semiconductor transistor structure, comprising:
   providing a substrate;
   epitaxially forming alternating stacked films over the substrate;
   forming a trench in the alternating stacked films over a first transistor region; and
   filling the trench over the first transistor region with a material different from that of the substrate, wherein the material is in direct contact with the alternating stacked films;
   after filling the trench over the first transistor region with the material partially removing the alternating stacked films over a second transistor region and the material obtaining an alternating stacked fin and a fin, wherein the alternating stacked fin is formed from the alternating stacked films, the fin is formed from the material, and the alternating stacked fin and the material are spaced apart from each other after partially removing the alternating stacked films over the second transistor region and the material.

2. The method of claim 1, further comprising:
   forming a dummy gate orthogonally over the fin.

3. The method of claim 2, wherein the partially removing of the alternating stacked films over the second transistor region and the partially removing of the material are performed concurrently.

4. The method of claim 2, further comprising:
   covering the fin over the first transistor region with a hard mask;
   releasing a nanowire from the alternating stacked fin; and
   removing the hard mask covering the fin.

5. The method of claim 1, wherein the forming of the trench comprises forming a vertical sidewall trench or a tapered trench tapering toward the substrate.

6. The method of claim 2, further comprising:
   depositing a first dummy oxide layer over the fin after obtaining the fin; and
   annealing the fin so as to transform the first dummy oxide layer to a second dummy oxide layer before forming the dummy gate orthogonally over the fin.

7. The method of claim 2, further comprising:
   depositing a first dummy oxide layer over the fin after obtaining the fin;
   removing the dummy gate over the fin to expose the first dummy oxide layer;
   annealing the fin so as to transform the first dummy oxide layer to a second dummy oxide layer; and
   removing the second dummy oxide layer.

8. A method for forming a hybrid semiconductor transistor structure, comprising:
   providing a substrate;
   epitaxially forming alternating stacked films over the substrate and in a p-type transistor region and an n-type transistor region;
   forming a trench in the alternating stacked films in the p-type transistor region;
   filling the trench in the p-type transistor region with silicon germanium; and
   after filling the trench in the p-type transistor region with silicon germanium partially removing the alternating stacked films over the n-type transistor region and the silicon germanium obtaining an alternating stacked fin and a silicon germanium fin, wherein the alternating stacked fin is formed from the alternating stacked films, and the silicon germanium fin is formed from the silicon germanium.

9. The method of claim 8, further comprising:
   forming a dummy gate orthogonally over a channel region of the silicon germanium fin and the alternating stacked fin;
   removing the dummy gate over the channel region of the silicon germanium fin and the alternating stacked fin; and
   releasing a silicon nanowire from the alternating stacked fin in the channel region.

10. The method of claim 9, further comprising:
    depositing a first dummy oxide layer over the silicon germanium fin after obtaining the silicon germanium fin; and
    annealing the silicon germanium fin so as to transform the first dummy oxide layer to a second dummy oxide layer before forming the dummy gate orthogonally over the silicon germanium fin.

11. The method of claim 9, further comprising:
    depositing a first dummy oxide layer over the channel region of the silicon germanium fin after obtaining the silicon germanium fin;
    removing the dummy gate over the silicon germanium fin to expose the first dummy oxide layer;
    annealing the silicon germanium fin so as to transform the first dummy oxide layer to a second dummy oxide layer; and
    removing the second dummy oxide layer.

12. The method of claim 8, wherein forming the trench comprises forming a vertical sidewall trench or a tapered trench tapering toward the substrate.

13. A method for forming a hybrid semiconductor transistor structure, comprising:
    providing a substrate;
    epitaxially forming alternating stacked films over the substrate;
    forming a trench in the alternating stacked films over a first transistor region;
    filling the trench with a material different from that of the substrate, wherein the material comprises germanium;
    forming a first transistor on the substrate, comprising:
    patterning the material obtaining a fin over the first transistor region, wherein the fin is formed from the material, and the first transistor has a first channel height; and
    forming a second transistor on the substrate, comprising:
    patterning the alternating stacked films over a second transistor region obtaining an alternating stacked fin, wherein the first channel height is greater than a separation between the alternating stacked fin and the fin.

14. The method of claim 13, wherein the second transistor comprises a second channel height, and the second channel height is substantially identical to the first channel height.

15. The method of claim 13, wherein the first channel height is greater than 2 times of the separation.

16. The method of claim 13, wherein the forming of the second transistor on the substrate comprises releasing a nanowire from the alternating stacked fin.

17. The method of claim 13, wherein the fin of the first transistor comprises $Si_xGe_{1-x}$, X being less than 0.6.

18. The method of claim 13, wherein the forming of the trench in the alternating stacked films over the first transistor region comprises removing the alternating stacked films and obtaining the trench with a tapered sidewall.

19. The method of claim 13, wherein there is a gap between the fin and the alternating stacked fin, and the method further comprises:

forming an isolation in a lower portion of the gap.

20. The method of claim 13, wherein the material comprises silicon germanium.

\* \* \* \* \*